US006407560B1

(12) United States Patent
Walraven et al.

(10) Patent No.: US 6,407,560 B1
(45) Date of Patent: *Jun. 18, 2002

(54) THERMALLY-INDUCED VOLTAGE ALTERATION FOR ANALYSIS OF MICROELECTROMECHANICAL DEVICES

(75) Inventors: Jeremy A. Walraven; Edward I. Cole, Jr., both of Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 108 days.

This patent is subject to a terminal disclaimer.

(21) Appl. No.: 09/596,858

(22) Filed: Jun. 19, 2000

Related U.S. Application Data

(63) Continuation-in-part of application No. 09/034,546, filed on Mar. 3, 1998, now Pat. No. 6,078,183.

(51) Int. Cl.[7] .............................................. G01R 31/02

(52) U.S. Cl. ....................................... 324/752; 324/765

(58) Field of Search ............................. 324/752, 750, 324/158.1, 73.1, 765, 500, 537; 356/445, 373, 375; 250/231.14, 227.11; 382/145

(56) References Cited

U.S. PATENT DOCUMENTS

| | | | |
|---|---|---|---|
| 5,047,713 A | 9/1991 | Kirino | 324/158 R |
| 5,422,498 A | 6/1995 | Nikawa | 257/48 |
| 5,430,305 A | 7/1995 | Cole, Jr. | 250/559.07 |
| 5,631,514 A | 5/1997 | Garcia | 310/309 |
| 5,659,244 A | 8/1997 | Sakaguchi | 324/158.1 |
| 5,708,371 A | 1/1998 | Koyama | 324/752 |
| 5,867,297 A * | 2/1999 | Kiang et al. | 359/198 |
| 5,990,473 A * | 11/1999 | Dickey et al. | 250/231.13 |
| 6,057,924 A * | 5/2000 | Ross et al. | 356/381 |
| 6,078,183 A * | 6/2000 | Cole, Jr. | 324/752 |

OTHER PUBLICATIONS

T. Koyama, Y. Mashiko, M. Sekine, H. Koyama and K. Horie, "New Non–Bias Optical Beam Induced Current (NB–OBIC) Technique for Evaluation of A1 Interconnects," Proceedings of the International Reliability Physics Symposium, pp. 228–233, 1995. (Month Unavailable).

K. Nikawa and S. Inoue, "Various Contrasts Identifiable From the Backside of a Chip by 1.3 $\mu$m Laser Beam Scanning and Current Change Imaging," Proceedings of the 22nd International Symposium for Testing and Failure Analysis, pp. 387–392, Nov. 18, 1996.

K. Nikawa and S. Inoue, "Detection and Characteriazation of Failures and Defects in LSI Chips by Optical Beam Induced Resistance Changes (OBIRCH),"Proceedings of DRIP 97: Institute of Physics Conference Series No. 160, pp. 37–46, Sep. 7, 1997.

(List continued on next page.)

Primary Examiner—Vinh P. Nguyen
(74) Attorney, Agent, or Firm—John P. Hohimen

(57) ABSTRACT

A thermally-induced voltage alteration (TIVA) apparatus and method are disclosed for analyzing a microelectromechanical (MEM) device with or without on-board integrated circuitry. One embodiment of the TIVA apparatus uses constant-current biasing of the MEM device while scanning a focused laser beam over electrically-active members therein to produce localized heating which alters the power demand of the MEM device and thereby changes the voltage of the constant-current source. This changing voltage of the constant-current source can be measured and used in combination with the position of the focused and scanned laser beam to generate an image of any short-circuit defects in the MEM device (e.g. due to stiction or fabrication defects). In another embodiment of the TIVA apparatus, an image can be generated directly from a thermoelectric potential produced by localized laser heating at the location of any short-circuit defects in the MEM device, without any need for supplying power to the MEM device. The TIVA apparatus can be formed, in part, from a scanning optical microscope, and has applications for qualification testing or failure analysis of MEM devices.

50 Claims, 16 Drawing Sheets

OTHER PUBLICATIONS

S. Ferrier, "Thermal and Optical Enhancements to Liquid Crystal Hot Spot Detection Methods," Proceedings of the 23rd International Symposium for Testing and Failure Analysis, pp. 57–62, Oct. 27, 1997.

K. Nikawa and S. Inoue, "New Capabilities of OBIRCH Method for Fault Localization and Defect Detection," Proceedings of the Sixth Asian Test Symposium (ATS '97), pp. 214–219, Nov. 17, 1997.

E.I. Cole Jr., P. Tangyunyong, D.A. Benson and D.L. Barton, "TIVA and SEI Developments for Enhanced Front and Backside Interconnection Failure Analysis," Proceedings of the 10th European Symposium on Reliability of Electronic Devices, Failure Physics and Analysis, pp. 991–996, Oct. 4, 1999.

* cited by examiner

Moveable Electrostatic Comb

Stationary Electrostatic Comb

Short-Circuit Defect

Short-Circuit Defect

Moveable Electrostatic Comb

Stationary Electrostatic Comb

Short-Circuit Defect

THERMALLY-INDUCED VOLTAGE ALTERATION FOR ANALYSIS OF MICROELECTROMECHANICAL DEVICES

CROSS REFERENCE TO RELATED APPLICATIONS

This is a continuation-in-part of application Ser. No. 09/034,546 filed Mar. 3, 1998 which issued Jun. 20, 2000 as U.S. Pat. No. 6,078,183.

GOVERNMENT RIGHTS

This invention was made with Government support under Contract No. DE-AC04-94AL85000 awarded by the U.S. Department of Energy. The Government has certain rights in the invention.

FIELD OF THE INVENTION

The present invention relates generally to failure analysis and qualification testing of integrated circuits (ICs) or microelectromechanical (MEM) devices, and specifically to an apparatus and method for analyzing an IC or MEM device for any open-circuit or short-circuit defects therein based on localized heating of electrical conductors or electrically-active members therein using a focused and scanned laser beam.

BACKGROUND OF THE INVENTION

Open-circuit and short-circuit defects in electrical conductors or electrically-active members in ICs or MEM devices can result in major yield and reliability problems. A capability for localizing and identifying these types of defects is important for analyzing ICs or MEM devices to determine failure mechanisms therein, for qualifying the ICs or MEM devices as known-good devices, and for implementing corrective action during fabrication to minimize the occurrence of such defects. Efficient and reliable detection for open-circuit and short-circuit defects will become of increasing importance as the number of interconnection levels and the length of interconnections increase with the development of new generations of ICs and MEM devices having on-board integrated circuitry. Efficient and reliable detection of short-circuit defects is also important for MEM devices where short-circuiting of electrically-active members can occur as a result of fabrication defects or stiction (i.e. adhesion of one or more electrically-active members with an adjacent electrically-active member or with a supporting substrate whereon the MEM device is formed.) Stiction in MEM devices can arise during fabrication of the devices (e.g. during an etch release step wherein one or more layers of a sacrificial material encapsulating the MEM device are removed to free the device for operation), or during use whenever surfaces of mechanical or electrically-active members of the MEM device come into contact.

Present ICs and MEM devices having on-board circuitry generally employ multiple levels of patterned metallization that can obscure lower electrical conductor levels, thereby complicating failure analysis or qualification testing from a device side (i.e. a top side) whereon the levels of patterned metallization are formed. Additionally, flip-chip packaging of ICs or MEM devices can make device-side analysis difficult, if not impossible. As a result, there is a need for the development of analysis methods that can operate on both a device-side and a substrate-side (i.e. a bottom side) of the ICs or MEM devices to be tested, thereby facilitating the detection of any open-circuit and short-circuit defects in the ICs or MEM devices.

Unfortunately, presently available substrate-side analysis methods are not totally effective in localizing open and shorted conductors. Furthermore, the presently available methods can be time consuming; they can yield a great deal of superfluous information; and they can provide only indirect evidence of open-circuit and short-circuit defects. What is needed is a rapid, sensitive method for analyzing ICs and MEM devices, with or without on-board circuitry, for open-circuit and short-circuit defects that operates under any mounting configuration.

An advantage of the apparatus and method of the present invention is that a high sensitivity for analyzing an IC or MEM device for any short-circuit defects therein can be realized by biasing the IC or MEM device with a constant-current source and measuring a change in a variable voltage of the source in response to a change in power demand by the IC produced upon irradiating a particular defect with a focused and scanned laser beam.

Another advantage is that, in some embodiments of the present invention for analyzing MEM devices, an induced voltage can be produced directly in the MEM device so that the constant-current source can be omitted.

Yet another advantage of the apparatus and method of the present invention is that any short-circuit defects can be located within an IC or MEM device from either a device side (i.e. a top side) or a substrate side (i.e. a bottom side) thereof.

Still another advantage of the present invention is that an entire die can be examined in a single image to locate any short-circuit defects therein.

Yet another advantage of the present invention is that it is nondestructive and can be used for qualification testing of ICs and MEM devices to locate any short-circuit defects therein. In the case of MEM devices when the short-circuit defects result from stiction, post-processing can be used to remove the stiction and thereby eliminate the short-circuit defects.

These and other advantages of the method of the present invention will become evident to those skilled in the art.

SUMMARY OF THE INVENTION

The present invention relates to a thermally-induced voltage alteration (TIVA) apparatus and method for analyzing a microelectromechanical (MEM) device formed on a substrate for any short-circuit defects therein. The TIVA apparatus in one embodiment thereof comprises a laser producing a laser beam; means for focusing and scanning the laser beam to irradiate a portion of the MEM device and thereby generate an induced voltage at the location of any short-circuit defects therein, the focusing and scanning means further providing a position signal to indicate the location of the laser beam on the irradiated portion of the MEM device; and means, comprising inputs of the induced voltage and the position signal, for indicating the location of each short-circuit defect within the irradiated portion of the MEM device. Although the substrate holding the MEM device can be formed of any suitable material (e.g. a semiconductor or a glass), the present invention is particularly suitable for analyzing MEM devices comprising a plurality of stacked layers of polycrystalline silicon formed on a silicon substrate.

The means for focusing and scanning the laser beam can comprise, for example, a scanning optical microscope. The means for indicating the location of each short-circuit defect within the irradiated portion of the MEM device can comprise, for example, a display or a computer, and can further include an image processor.

The TIVA apparatus can further comprise a stage for holding the MEM device, with the stage optionally including means for heating or cooling the MEM device. Additionally, the TIVA apparatus can include a switch matrix, connected between the MEM device and the means for indicating the location of each short-circuit defect within the irradiated portion of the MEM device, for selecting among a plurality of electrical connections to the MEM device (e.g. to select among a plurality of electrically-active members in the MEM device). The switch matrix can be operated manually or by computer control. The TIVA apparatus can also comprise a voltage amplifier, connected between the MEM device and the means for indicating the location of each short-circuit defect within the irradiated portion of the MEM device, for amplifying the induced voltage. The voltage amplifier, which provides an increased sensitivity for detection of any short-circuit defects in the MEM device, can be either alternating-current (ac) coupled or direct-coupled (dc) coupled. Finally, the TIVA apparatus can comprise a photodetector (e.g. a silicon or germanium photodetector) for detecting a portion of the laser beam reflected or scattered from the MEM device. An electrical signal generated by the photodetector can be provided to the indicating means to generate a reflected-light image of the irradiated portion of the MEM device. This reflected-light image can then be superposed in the indicating means with a generated image of each short-circuit defect to provide for precise location of the short-circuit defects within the MEM device.

The laser in the TIVA apparatus can be selected to provide a wavelength for the laser beam that is in the range of 0.3 $\mu$m to 2.5 $\mu$m, depending upon whether the laser beam is to irradiate the MEM device from a top side of the substrate proximate to the MEM device, or whether the laser beam is to irradiate the MEM device from a bottom side of the substrate distal from the MEM device with the laser beam being transmitted through the substrate. For substrate-side irradiation when the substrate comprises, for example, silicon a neodymium:aluminum:garnet (Nd:YAG) laser operating at 1.32 $\mu$m, or alternately a neodymium:yttrium-vanadium-oxide (Nd:YVO$_4$) laser operating at 1.34 $\mu$m can be used.

The TIVA apparatus in another embodiment thereof comprises a stage for holding the MEM device; a laser generating a laser beam; a scanning optical microscope (SOM) for focusing and scanning the laser beam to irradiate a portion of the MEM device and thereby generate an induced voltage at the location of any short-circuit defect therein, with the scanning optical microscope further providing a position signal to indicate the location of the laser beam on the irradiated portion of the MEM device; and a display for receiving inputs of the induced voltage and the position signal to indicate the location of each short-circuit defect within the irradiated portion of the MEM device. In this embodiment of the present invention, the stage can optionally include means for heating or cooling the MEM device; and the SOM can include a photodetector for detecting a portion of the laser beam reflected or scattered from the MEM device. The photodetector is useful for providing an input to the display to generate a reflected-light image of the irradiated portion of the MEM device to aid in locating any short-circuit defects detected by the TIVA apparatus. The TIVA apparatus can further include a voltage amplifier connected between the MEM device and the display for amplifying the induced voltage, and a switch matrix connected between the MEM device and the display for selecting among a plurality of electrical connections to the MEM device. The laser used in the TIVA apparatus generates a laser beam having a wavelength that is generally in the range of 0.3 $\mu$m to 2.5 $\mu$m.

In yet other embodiments of the present invention, the TIVA apparatus comprises a constant-current source connected to the MEM device to supply a constant current and a variable voltage thereto, with the voltage provided by the constant-current source to the MEM device changing in response to a change in power demand by the MEM device; a laser producing a laser beam; means for focusing and scanning the laser beam to irradiate a portion of the MEM device and thereby change the power demand by the MEM device when the laser beam irradiates any short-circuit defect in the MEM device, the focusing and scanning means providing a position signal to indicate the location of the laser beam on the MEM device; and means, comprising inputs of the changing voltage and the position signal, for indicating the location of each short-circuit defect within the irradiated portion of the MEM device. The focusing and scanning means can be provided, for example, in a conventional scanning optical microscope. The TIVA apparatus can further include a stage for holding the MEM device, with the stage optionally including means for heating or cooling the MEM device. A photodetector can be provided in the TIVA apparatus for detecting a portion of the laser beam reflected or scattered from the MEM device to generate a reflected-light image of the MEM device which can be superposed with a generated image of the short-circuit defect to aid in precisely locating the defect in the MEM device. An optional voltage amplifier can be connected between the constant-current source and the means for indicating the location of each short-circuit defect within the irradiated portion of the MEM device to amplify the changing voltage to provide a more sensitive analytical capability. An image processor can also be included in the indicating means for accumulating or averaging images to increase the sensitivity of the TIVA apparatus. Finally, a switch matrix can be connected between the constant-current source and the MEM device for controlling a plurality of electrical connections to the MEM device. This embodiment of the present invention is particularly useful for locating short-circuit defects in a MEM device formed on a silicon substrate that also includes integrated circuitry (e.g. an IC) formed on the same substrate. Here, the TIVA apparatus can be used to detect short-circuit defects in the MEM device using a laser wavelength in the range of 0.3–2.5 $\mu$m. The TIVA apparatus can also be used to detect open-circuit or short-circuit defects in integrated circuitry formed on the same substrate as the MEM device. In this case, the laser can be provided with a beam having a photon energy less than a bandgap energy of the silicon substrate (i.e. a wavelength in the range of 1.2–2.5 $\mu$m) to prevent the generation of photocurrents due to photogenerated carriers (i.e. electrons and holes) in the integrated circuitry.

The present invention also relates to a method for analyzing a MEM device, comprising steps for irradiating a portion of the MEM device with a focused and scanned laser beam and thereby generating an induced voltage at the location of any short-circuit defect therein; and sensing the position of the focused and scanned laser beam and the induced voltage for determining the location of each short-circuit defect in the MEM device. The sensing step can further comprise forming an image showing the location of each short-circuit defect within the MEM device. The method can additionally include one or more of the following steps: a step for heating or cooling the MEM device; a step for amplifying the induced voltage prior to the sensing step, and a step for generating a reflected-light image of the irradiated portion of the MEM device by detecting a reflected or scattered portion of the irradiating laser beam. This method is particularly useful for analyzing MEM devices which do not have integrated circuitry comprising a plurality of transistors formed on the same substrate as the MEM device.

Finally, the present invention relates to a method for analyzing a MEM device that comprises steps for supplying electrical power to the MEM device from a constant-current source having a constant current and a variable voltage that changes in response to a change in a power demand by the MEM device; irradiating a portion of the MEM device with a focused and scanned laser beam and thereby changing the power demand of the MEM device; and detecting any short-circuit defects within the irradiated portion of the MEM device by sensing a position of the focused and scanned laser beam and a change in the variable voltage from the constant-current source. The step for detecting each short-circuit defect within the MEM device can further comprise forming an image showing the location of the short-circuit defect in the MEM device. The method can additionally include steps for forming a reflected-light image of the MEM device (e.g. by detecting a portion of the laser beam reflected or scattered from the MEM device using a photodetector), and superposing the reflected light-image with the image of the short-circuit defect to form a composite image for locating each short-circuit defect in the irradiated portion of the MEM device. The method can also include a step for amplifying the change in the variable voltage prior to the detecting step. This method can be used for analyzing MEM devices with or without on-board integrated circuitry (i.e. integrated circuitry formed on the same substrate as the MEM device).

Additional advantages and novel features of the invention will become apparent to those skilled in the art upon examination of the following detailed description thereof when considered in conjunction with the accompanying drawings. The advantages of the invention can be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings:

FIG. 6a shows a magnified and rotated image of the open-circuit defect of FIG. 5a.

FIG. 8a shows an enlarged TIVA image of the portion of the SRAM IC immediately surrounding the short-circuit defect in FIG. 7a.

FIG. 12a shows an enlarged view of FIG. 11a; and

DETAILED DESCRIPTION OF THE INVENTION

Figure 1:
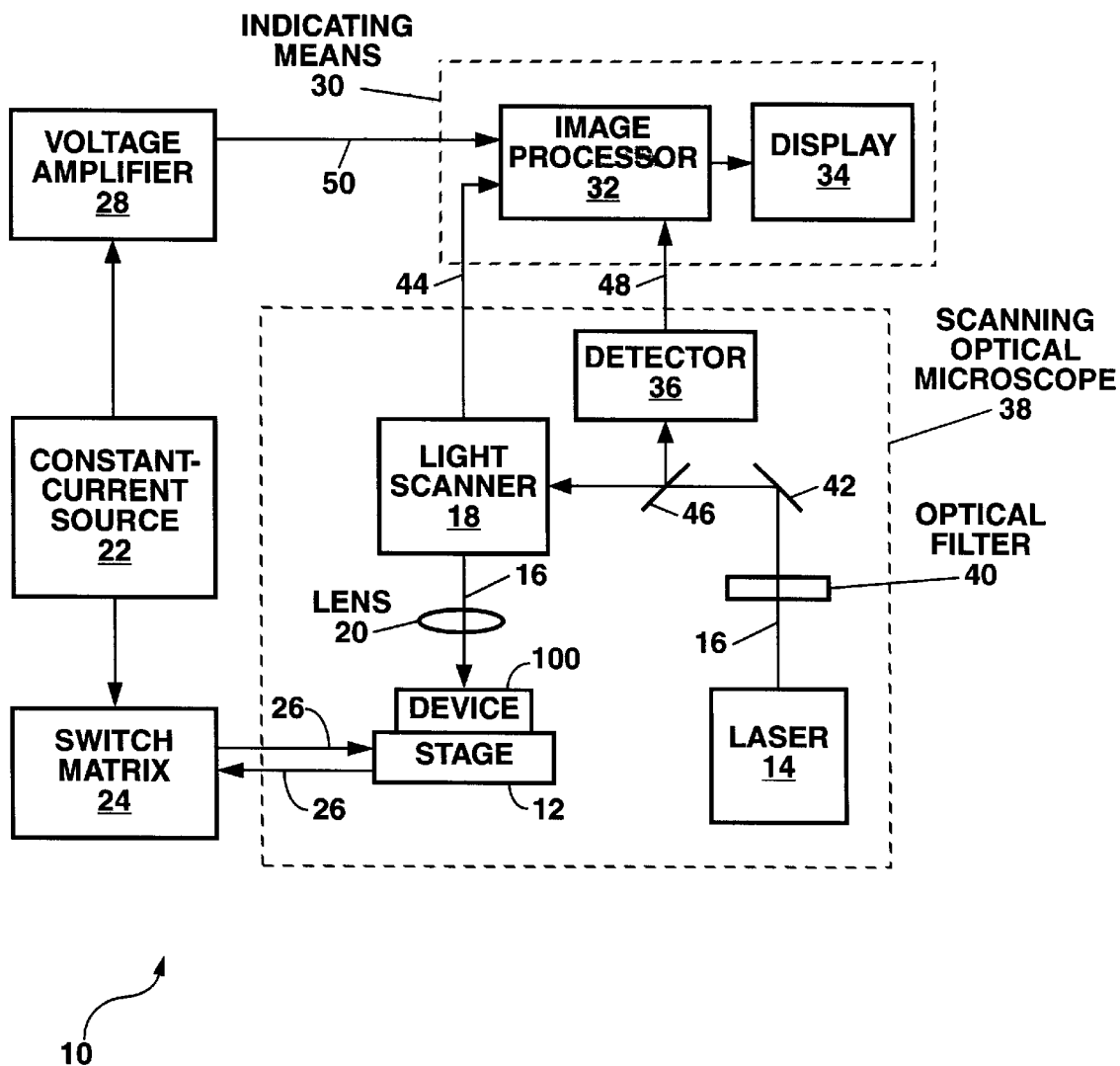
FIG. 1 shows a schematic representation of an embodiment of the thermally-induced voltage alteration (TIVA) apparatus of the present invention utilizing a constant-current source.

Referring to FIG. 1, there is shown schematically an embodiment of the thermally-induced voltage alteration (TIVA) apparatus 10 of the present invention. The TIVA apparatus 10 comprises a stage 12 for holding at least one semiconductor device 100 (e.g. an IC or a MEM device) to be tested; a laser 14 producing a light beam 16 which is directed through a light scanner 18 and focused by a lens 20 to irradiate a predetermined portion of the device 100; and a constant-current source or power supply 22 connected to power the device 100 via a switch matrix 24 and electrical connections 26. In FIG. 1, the TIVA apparatus 10 further comprises a voltage amplifier 28 connected between the constant-current source 22 and an indicating means 30, with the indicating means 30 further comprising an image processor 32 and a display 34. A detector 36 also provides an output to the indicating means 30 to generate a reflected-light image of the portion of the IC 100 being irradiated.

The TIVA apparatus 10 in FIG. 1 can comprise a scanning optical microscope (SOM) 38 which can include elements of the present invention shown within the large dashed box, including the stage 12, the light scanner 18, the focusing lens 20 (e.g. an objective lens) and the photodetector 36. The laser 14 can either be included within the SOM 38 as shown in FIG. 1, or can be located outside and separate from the SOM 38 (e.g. with free-space or fiber optic coupling). The scanning optical microscope 38 can further include an eyepiece or video camera (not shown) for visually identifying a portion of the device 100 to be analyzed with the TIVA apparatus 10.

For use of the TIVA apparatus 10, at least one device 100 to be analyzed is placed on the stage 12 with a plurality of electrical connections 26 being made to and from the device 100 including a constant current, $I_{DD}$, and a variable voltage, $V_{DD}$, from the source 22. The stage 12 can optionally be heated or cooled to maintain the device 100 at a predetermined temperature. The stage 12 can be heated, for example, with an electrical resistance heating element or a thermoelectric module; whereas cooling of the stage 12 can be performed, for example, with a refrigeration system or with a thermoelectric module.

In FIG. 1, the electrical connections 26 can be routed to the device 100 through the stage 12, or alternately the connections 26 can be made directly to the device 100. The device 100 to be tested can be in wafer form (i.e. a plurality of ICs or MEM devices on a common semiconductor substrate), in die form (i.e. a single unpackaged IC or MEM device), or in packaged form. For analysis of a completely packaged IC or MEM device 100, a portion of the device package can be removed (e.g. by lid removal or mechanical polishing) to expose a particular side of the device for optical access by the focused and scanned laser beam 16. The term "analysis" as used herein is intended to refer to both failure analysis and qualification testing.

If the device 100 to be tested is mounted on a chip-carrier or package with a device side (defined herein as a top side of a semiconductor substrate proximate to the IC or MEM device 100) exposed, then the TIVA apparatus 10 will generally be used to initially irradiate the device side for analysis. In performing failure analysis on a known-bad IC 100, if no open-circuit or short-circuit defects are found using device-side irradiation, the device side of the IC 100 can be potted in epoxy so that the IC package can be mechanically polished to expose a substrate side (defined herein as a bottom side of the substrate whereon the IC or MEM device is fabricated) of the IC 100. A substrate-side analysis of the IC 100 can then be performed with the TIVA apparatus 10 by transmitting the focused and scanned laser beam 16 through the semiconductor substrate to irradiate the electrical conductors in the IC 100 in order to locate the defect. The use of a substrate-side analysis is particularly advantageous when the defect is located in a buried electrical conductor (i.e. a conductor buried below one or more levels of metallization) which is optically inaccessible from the device side of the IC 100.

Similarly, if the IC or MEM device 100 being tested is mounted in a flip-chip arrangement with the substrate side of the device 100 exposed, then the TIVA apparatus 10 can be used with the laser beam 16 transmitted through the semiconductor substrate to irradiate the IC or MEM device 100 for analysis thereof. If needed, the substrate side of the flip-chip-mounted device 100 can be polished to reduce scattering of the incident laser beam 16 (e.g. when the substrate has a rough or unpolished bottom surface). Additionally, the substrate side of the device 100 can be thinned to reduce an absorption of the laser beam 16 (e.g. for a heavily doped semiconductor substrate providing a substantial absorption of the laser beam 16).

The constant-current source 22 in FIG. 1 is operated in a constant-current mode to provide a predetermined current generally in the microampere ($\mu$A) to milliampere (mA) range depending upon a particular type of device 100 to be tested. In some instances (e.g. for MEM devices), the constant-current source can be operated to provide a minimum available current (e.g. about 1 $\mu$A or less). The constant-current source 22 further provides a variable supply voltage generally in the range of about 1–9 volts, and preferably in the range of 3.3–5 volts for a complementary-metal-oxide-semiconductor (CMOS) IC 100. An example of a constant-current source 22 that can be used for practice of the present invention is a Keithley Instruments, Model 238 Source Measurement Unit which is computer controllable.

In FIG. 1, the constant-current source 22 is routed through a switch matrix 24 to the device 100 under test. This arrangement allows the electrical connections 26 to the device 100 to be controlled and reconfigured as necessary. For analysis of an IC 100, the switch matrix 24 can be in the form of a digital tester which provides for toggling the IC 100 between a plurality of logic states therein using a set of predetermined test vectors. Toggling of various logic states in the IC 100 can be important since any electrical conductors having open-circuit or short-circuit defects therein can only be located with the TIVA apparatus 10 when the focused and scanned laser beam 16 produces a localized heating that alters the power demand by the IC 100. Thus, the electrical conductor having an open-circuit or short-circuit defect therein must be operationally connected to a transistor or other element in the IC 100 that is drawing electrical power from the constant-current source 22 in order for the TIVA apparatus 10 to locate the defect within that electrical conductor. In FIG. 1, control of the switch matrix 24 can be performed either manually or with a computer. Manual control of the switch matrix 24 is generally sufficient for testing of MEM devices 100 which include only a small number of electrical connections 26. For analysis of MEM devices 100 having integrated circuitry formed on the same substrate, a computerized control of the switch matrix 24 can be used.

For analysis of an IC 100 or a MEM device 100 having integrated circuitry formed on the same substrate, the laser 14 in FIG. 1 generally provides a beam 16 having a photon energy that is less than a bandgap energy of the semiconductor substrate whereon the IC or MEM device 100 is formed so that the beam 16 does not produce photogenerated free electron-hole pairs at semiconductor interfaces or junctions within the IC 100. Since electrical connections in the IC or MEM device with on-board integrated circuitry can be analyzed for any open-circuit or short-circuit defects therein, any effect occurring at semiconductor interfaces or junctions due to photogenerated free electron-hole pairs can result in the generation of spurious signals that can complicate the analysis. Such photogeneration, however, can be eliminated by providing a photon energy for the light beam 16 that is less than the bandgap energy of the semiconductor substrate. For a silicon substrate, the photon energy is preferably less than 1.1 electron volts (eV), and for a gallium arsenide (GaAs) substrate, the photon energy is preferably less than 1.4 eV.

For a MEM device 100 without on-board integrated circuitry, photogeneration is not a problem so that the photon energy for the light beam 16 need not be less than the bandgap energy of the semiconductor substrate when irradiation of the MEM device is performed from the top side of the substrate. When the irradiation is performed through the substrate, the photon energy can be selected to be less than the bandgap energy of the semiconductor substrate to maximize the transmission of the light beam 16 through the substrate (see FIG. 2).

The wavelength of the laser beam 16 is inversely related to photon energy so that the wavelength of the laser beam 16 is generally in the range of 1.2–2.5 μm for analysis of an IC 100 or a MEM device 100 having on-board integrated circuitry when the substrate comprises silicon. For analysis of a MEM device 100 without on-board integrated circuitry, the wavelength of the laser beam 16 can be in the range of 0.3–2.5 μm depending upon the particular type of laser used and whether the MEM device 100 is irradiated from the top side of the substrate or through the substrate. A shorter wavelength for the laser 14 generally produces a better spatial resolution in the TIVA and reflected-light image, and also is more strongly absorbed by a semiconductor substrate.

Figure 2:
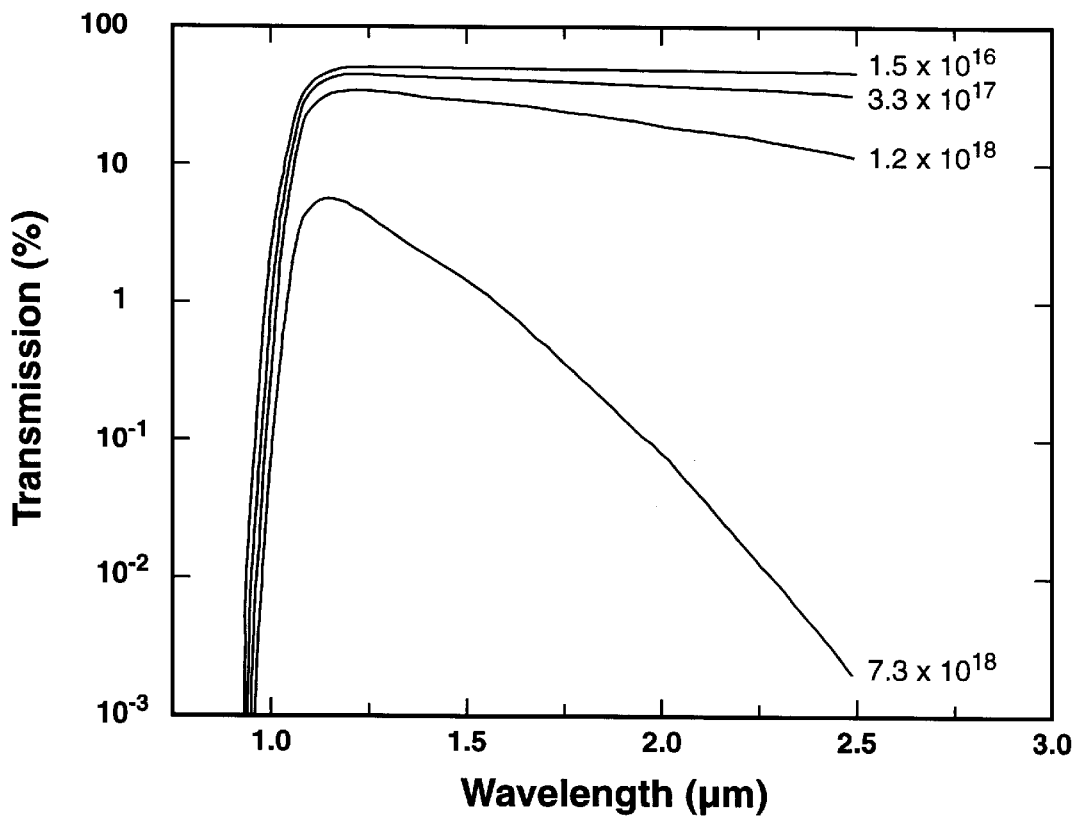
FIG. 2 shows transmission curves over a wavelength range of about 1.0–2.5 $\mu$m for 625-$\mu$m-thick silicon substrates having various p-type dopant concentrations from $1.5\times10^{16}$ cm$^{-3}$ to $7.3\times10^{18}$ cm$^{-3}$.

For substrate-side irradiation of the device 100, the transmission through the semiconductor substrate must be considered since this will affect a power level of the laser beam 16 for irradiating the device 100. Transmission through the substrate will depend upon the semiconductor composition of the substrate (e.g. Si or GaAs), and also on a doping type (i.e. n- or p-type doping) and dopant concentration of the substrate. As an example, FIG. 2 shows transmission curves over a wavelength range of about 1.0–2.5 μm for 625-μm-thick silicon substrates having various p-type dopant concentrations (in cm$^{-3}$). At low dopant concentrations, the laser 14 being transmitted through the substrate can have a wavelength in the range of about 1.2–2.5 μm; whereas, as the p-type dopant concentration is increased, a preferred wavelength range for maximum transmission of the laser beam 16 is reduced on the long-wavelength side (i.e. wavelengths nearer to 1.2 μm are to be preferred to produce a maximum localized heating effect when transmitting the laser beam 16 through the substrate).

One particular type of laser 14 that can be used for practice of the present invention is a neodymium laser, such as a neodymium:yttrium-vanadium-oxide (Nd:YVO$_4$) laser operating at a wavelength of 1.34 μm. Another type of laser 14 that can be used is a neodymium:yttrium-aluminum-garnet (Nd:YAG) laser operating at a wavelength of 1.32 μm. Both of these laser types can be used for substrate-side irradiation of an IC or MEM device 100. An optical filter 40 can optionally be placed in the path of the light beam 16 from these types of lasers if necessary to eliminate any lasing wavelengths less than or equal to the bandgap of the semiconductor substrate (i.e. at photon energies greater than or equal to the bandgap energy). The use of an optical filter 40 in the path of the laser beam 16 can be especially advantageous when the laser 14 emits at multiple lasing wavelengths with one or more of the wavelengths being sufficiently close to or above the bandgap energy of the semiconductor substrate or transistors formed therein to produce photogenerated free electron-hole pairs which result in spurious images that can complicate the analysis of the IC 100 or a MEM device 100 having on-board integrated circuitry. Additionally, a half-wave plate can be inserted in the path of the laser beam 16 and oriented to reduce reflection losses from downstream optical elements, especially when a scanning optical microscope 38 is used in the TIVA apparatus 10.

When used for analyzing MEM devices 100 without any on-board integrated circuitry, any type of laser 14 operating in the wavelength range of 0.3–2.5 μm can be used, with the operating range of the laser 14 preferably being 1.2–2.5 μm when the laser beam 16 is to be transmitted through the substrate to irradiate the MEM device 100. Suitable types of lasers include gas lasers (e.g. helium-cadmium, helium-neon, argon or krypton lasers), semiconductor lasers (e.g. gallium arsenide or indium gallium arsenide semiconductor diode lasers), and solid-state lasers (e.g. Nd:YAG or Nd:YVO$_4$ lasers operating at a fundamental wavelength, or frequency-doubled). A particular laser can be selected for practice of the present invention according to its operating wavelength and output power and whether or not the laser is to be transmitted through the substrate to irradiate the device 100 to be analyzed.

Figure 12A:
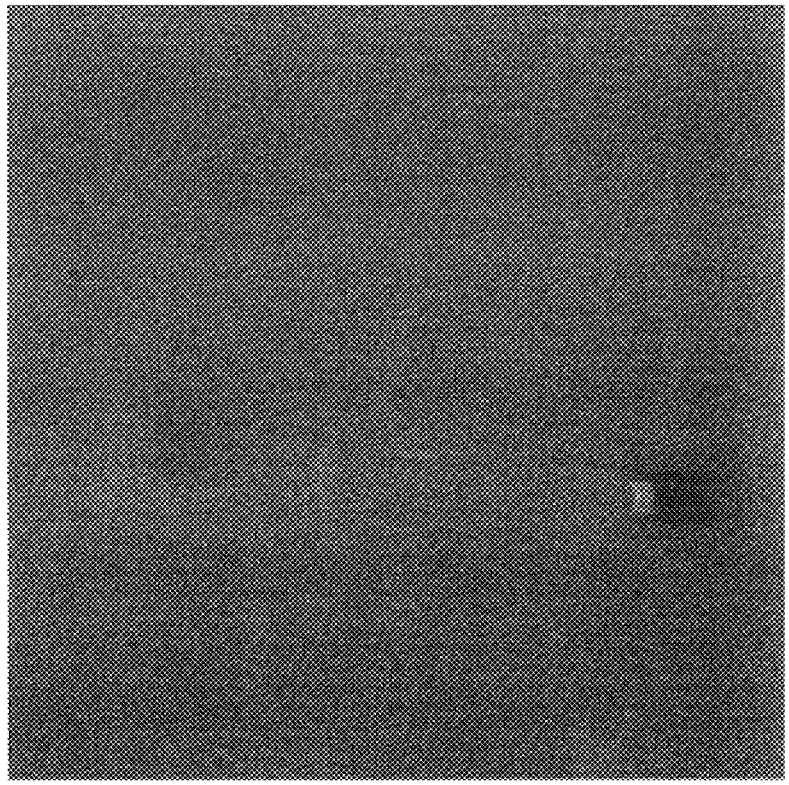
Figure 12B:
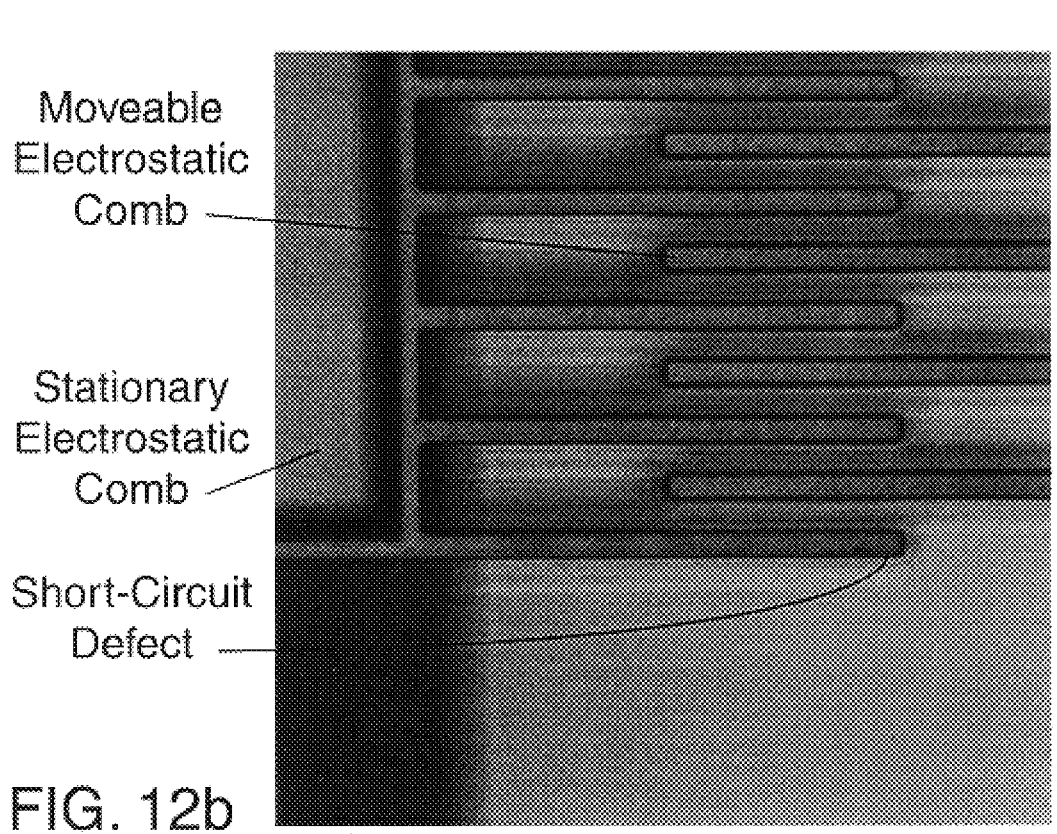
FIG. 12b shows an enlarged view of FIG. 11b indicating that the short-circuit defect is due to contact between an unsupported end of a lowermost finger of a stationary comb of the electrostatic comb actuator and the underlying substrate.

In FIG. 1, the laser 14 preferably operates in a single transverse mode for optimal focusing of the laser beam 16. The laser 14 can operate either in a continuous-wave (cw) mode, or in a pulsed mode, with an output power, for example, from a few milliwatts (mW) to a few hundred mW depending on a focused spot size of the laser beam 16 and whether the irradiation is from the device side or the substrate side of the device 100. Since electrically-active members (e.g. fingers of a electrostatic comb actuator as shown in FIGS. 12b and 13b) of MEM devices 100 are suspended above a supporting substrate and therefore thermally isolated from the substrate, a lower laser power is generally required when analyzing a MEM device 100 as compared to the laser power required for analysis of an IC 100.

In FIG. 1, the laser beam 16 is directed from the laser 14 by one or more mirrors 42 into the light scanner 18 which scans the focused light beam 16 over a predetermined portion of the device 100 being analyzed. The light scanner 18 can comprise a pair of galvanometer-driven mirrors in an x-y arrangement and an output position signal 44 that indicates an x-y position of the focused laser beam 16 on the portion of the device 100 being scanned. The application of electrical driving signals to these galvanometer-driven mirrors can be used to generate a raster scan over the entire portion of the device 100, or mask layout information can be provided to a computer and used to generate a scan of the focused laser beam 16 that is confined to the electrical conductors or electrically-active members of the device 100. The scan of the focused laser beam 16 can also be continuous or discontinuous (e.g. irradiating discrete pixels to form a 512×512 pixel scan of the portion of the device 100 being analyzed). Finally, the focused laser beam 16 can be repetitively scanned over each line of a continuously-scanned image or stopped at each pixel of a discontinuously-scanned image to provide for signal averaging to improve a signal-to-noise ratio in the generated image for identification of any open-circuit or short-circuit defects in an IC 100, or for identification of any short-circuit defects in a MEM device 100. While the TIVA apparatus 10 of the present invention can locate both open-circuit defects and short-circuit defects in an IC 100 or in integrated circuitry located on a common substrate with a MEM device 100, the apparatus 10 is limited to the detection of short-circuit defects in a MEM device 100 without any on-board integrated circuitry.

The scannable light beam 16 is focused by lens 20 (or alternately by one or more curved mirrors) to a predetermined spot size that is generally on the order of the width of the electrical conductors in the IC 100 or the electrically-active members in the MEM device 100 for optimal heating effect. The focused laser beam spot can range in size from a wavelength of the light (e.g. 0.3–2.5 $\mu$m) up to a few microns (e.g. 5–50 $\mu$m) depending upon the type of device 100 being analyzed and a feature size therein.

In FIG. 1, a reflected-light image of features in the device 100 can be generated by collecting and detecting a portion of the incident laser beam 16 that is reflected or scattered from the features in the device 100. The reflected or scattered light can be collected with the lens 20 in FIG. 1 and conveyed back along the laser-beam path to a partially-reflecting mirror 46 and therefrom to a detector 36 (e.g. a silicon for laser wavelengths below about 1.1 $\mu$m and a germanium photodetector for laser wavelengths above about 1.1 $\mu$m). The detector 36 produces a reflected-light signal 48 that can be sensed by the indicating means 30 in combination with the laser-beam position signal 44 to generate the reflected-light image of the device 100. The provision of a reflected-light image in the TIVA apparatus 10 is advantageous for focusing the laser beam 16 at a plane of the electrical conductors or electrically-active members to be examined, and for precisely locating any defects in the device 100 that have been identified with the TIVA apparatus 10. A reflected-light image can be formed with irradiation of the device 100 from either the device side or the substrate side. In general, the resolution of the reflected-light image will depend upon the spot size of the focused laser beam 16. Additionally, polishing of the substrate side can be advantageous for improving the quality of the reflected-light image when this mode of irradiation is selected.

In the present invention, different mechanisms are used to detect open-circuit and short-circuit defects as described hereinafter. In each case, the scanned laser beam 16 is used to produce localized thermal gradients (i.e. localized heating) within the electrical conductors or electrically-active members, or within a short-circuit between adjacent electrical conductors or electrically-active members. The effects of the thermal gradients on device power consumption (i.e. power demand) are detected by monitoring voltage fluctuations of the constant-current source 22 with the device 100 biased at a predetermined constant current.

Open-circuit electrical conductors are defined herein as electrically conducting pathways in an IC 100, or in integrated circuitry formed alongside a MEM device 100 on a common substrate, whose ability to transfer electrical signals has been compromised by one or more failure mechanisms such as stress voiding, electromigration, silicon migration into a metal conductor, a design defect, or a processing defect. Such open-circuit electrical conductors can be detected with the TIVA apparatus 10 by using the Seebeck Effect to change the power demand by the device 100. Short-circuit conductors in an IC or MEM device 100 can be detected by a resistance change in a short-circuit conducting pathway that alters the power demand by the device 100. Since the current being supplied to the device 100 is kept constant by the constant-current source 22, any change in power demand by the device 100 results in a change in the voltage provided by the constant-current source 22. It is this voltage change that is detected according to the embodiment of the TIVA apparatus 10 shown in FIG. 1.

In the Seebeck Effect, thermal gradients in electrical conductors generate electrical potential gradients (i.e. voltage gradients) similar to a thermocouple formed by contact between two dissimilar metals when heated produces a thermocouple voltage. An electrical potential produced by localized heating within electrical conductors that are not thermally isolated from the substrate has a value on the order of microvolts ($\mu$V) for each °C. of heating. Thermal modeling results for an IC 100 formed on a silicon substrate show that a focused 1.34 $\mu$m-wavelength laser beam 16 will produce about a localized 1° C. change in temperature of the electrical conductor for each milliwatt of laser irradiation. Thus, a 120 mW single-lateral-mode polarized Nd:YVO$_4$ laser producing about 30 mW of laser irradiation (after taking into account transmission losses in the TIVA apparatus 10 and in the IC 100) on an electrical conductor within the IC 100 can produce a localized thermal gradient on the order of 30° C. For electrically-active members of a MEM device 100 which are thermally isolated from the substrate, the electrical potential produced by laser heating can be much larger.

In an electrical conductor within an IC 100 that is electrically intact without any defects, any gradient in electrical potential produced by localized heating due to irradiation with the focused laser beam 16 is readily compensated for by a transistor or a power bus that is electrically driving that conductor so that essentially no change in the source voltage occurs. However, if that conductor is electrically isolated from the transistor or power bus, the gradient in electrical potential produced by the localized heating will produce a change in the potential (i.e. voltage) on that conductor. Such change in potential of the open-circuit electrical conductor can affect a bias condition of any transistors whose gates are connected to the conductor, thereby altering a saturation condition and power dissipation of those transistors to produce an amplifying effect which in turn alters the power demand of the IC 100. The change in power demand by the IC 100 can be detected by monitoring the change in voltage of the constant-current source 22, which together with the laser-beam position signal 44 can be used to locate the open-circuit electrical conductor in the IC 100. It should be noted that a change in potential on an open-circuit electrical conductor that does not drive any transistor gates (e.g. an open-circuit power bus) may not change the power demand of the IC 100, and therefore may not be detected with the TIVA apparatus 10.

Localized heating produced by irradiation of an electrical conductor with the focused laser beam 16 can also be used to detect a short-circuit defect responsible for short circuiting of two or more adjacent conductors in an IC 100. Similarly a short-circuit defect in a MEM device 100 produced, for example, by contact between an electrically-active member and the underlying substrate, or between a pair of adjacent electrically-active members, can be detected with the TIVA apparatus 10. A short-circuit defect can increase power demand by the device 100 being tested when the shorted electrical conductors are at different electrical potentials (e.g. corresponding to logical "0" and "1" states in an IC 100). The power demand resulting from the short-circuit defect can depend on the resistance in the short-circuit conducting pathway and its location within the device 100. As the focused laser beam 16 is scanned over the portion of the device 100 containing the short-circuit defect, the localized heating of the short-circuit defect proportionally changes the resistance of the defect according to the equation:

$$\rho = \rho_0[1 + \alpha(T - T_0)]$$

where $\rho_0$ is the resistivity of the short-circuit defect at a reference temperature $T_0$ in the absence of any localized heating, T is the temperature of the short-circuit defect produced by localized heating with the focused laser beam 16, and α is a temperature coefficient of resistivity of a metal, metal alloy or semiconductor material forming the short-circuit defect.

The change in resistance of the short-circuit defect upon heating with the focused laser beam 16 results in a change in power demand by the device 100, thereby resulting in a change in the voltage of the constant-current source 22 which can be detected to locate the short-circuit defect. A short-circuit defect between a pair of adjacent signal lines in an IC 100 generally produces a larger detectable voltage change than does a short-circuit defect between adjacent power buses. This is due to the signal lines being connected to the gate of one or more transistors, thereby changing the bias condition for those transistors and producing an amplifying effect on the power demand by the IC 100 as described previously for open-circuit defects.

Using the same device biasing with the constant-current source 22 and localized heating by the focused and scanned laser beam 16, both open-circuit and short-circuit defects can be identified and located within an IC 100 being tested. Furthermore, the method of the present invention for measuring changes in the supply voltage to the device 100 with constant-current biasing conditions provides an extremely sensitive method for detecting minute changes in power demand by the device 100 being tested.

A comparison between measuring a voltage change under constant-current biasing conditions and measuring a current change under constant-voltage biasing conditions in a CMOS IC 100 using the same laser irradiation shows that a much larger change in voltage can be produced under constant-current biasing compared to the change in current produced under constant-voltage biasing. For example, a change in IC power demand that produced a 15 nanoampere (nA) change in current to the IC 100 under constant-voltage biasing was found to produce a 300 millivolt (mV) change in the supply voltage under constant-current biasing. The comparison can be even more dramatic for very-low-power CMOS ICs where a change in IC power demand that produces a 100 picoampere (pA) current change under constant-voltage biasing was found to produce a 100 mV change in the supply voltage under constant-current biasing. Thus, the high detection sensitivity provided by the TIVA apparatus of FIG. 1 using constant-current biasing can produce a detectable voltage change signal when no current change signal is detectable under constant-voltage biasing of the IC 100.

With the TIVA apparatus 10 of FIG. 1, supply voltage ($V_{DD}$) changes on the order of 0.1 mV are detectable. These small voltage change signals can be further amplified with a voltage amplifier 28 connected between the constant-current source 22 and the indicating means 30 to provide an amplified voltage signal 50. When used for testing of ICs or MEM devices having on-board integrated circuitry, the voltage amplifier 28 is preferably an alternating-current (a-c) coupled amplifier such as an Ithaco Corporation, Model 1201B voltage amplifier. The voltage amplifier 28 can have a selectable gain of up to $10^3$–$10^4$ for amplifying very small changes in the supply voltage.

In FIG. 1, the indicating means 30 comprises an image processor 32 and a display 34 (e.g. a cathode ray tube or television monitor). Inputs of the changing voltage (i.e. the voltage change signal from the constant-current source, or the amplified voltage signal 50) and the laser-beam position signal 44 are received into the indicating means 30 at the image processor 32 to generate an x-y output signal (e.g. a video output signal) for driving the display 34 to form a TIVA image for locating the open-circuit or short-circuit defect. Open-circuit and short-circuit defects can appear as either light or dark spots in the TIVA image, depending on whether the power demand by the device 100 is increased or decreased by the presence of the defects, thereby increasing or decreasing the voltage provided by the constant-current source 22.

In FIG. 1, a reflected-light signal 48 can also be provided as an input to the image processor 32 to form a reflected-light image of the device 100 being tested. The image processor 32 can further be used to superpose the TIVA image with the reflected-light image to form a composite image to aid in precisely locating the defects within the device 100. Additionally, the image processor 32 can provide capabilities for processing and storing the signals 44, 48 and 50, including averaging, contrast enhancing and digitizing the signals. The indicating means 30 can be a part of the scanning optical microscope 38; or it can be in the form of a separate instrument (e.g. a computer or a signal analyzer).

A series of examples are provided hereinafter to illustrate the use and capability of the present invention for analyzing different types of devices 100 for open-circuit or short-circuit defects therein using the TIVA apparatus of FIG. 1 and using either device-side or substrate-side irradiation with the focused and scanned laser beam 16.

Figure 3A:
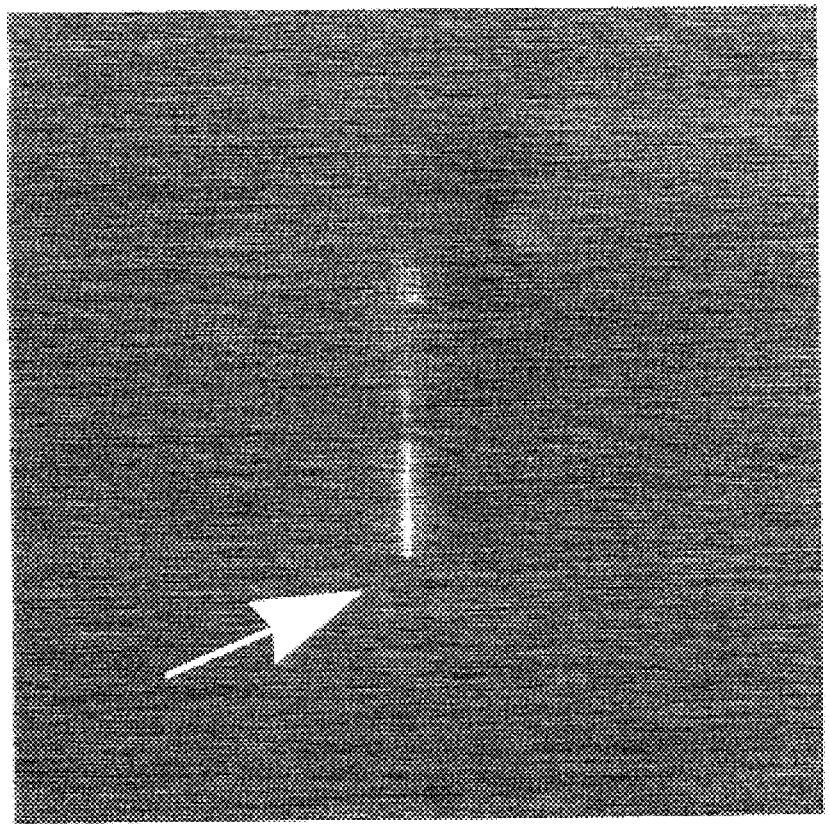
FIG. 3a shows an image of an open-circuit defect in a CMOS IC obtained with the TIVA apparatus of the present invention using device-side laser irradiation.
Figure 3B:
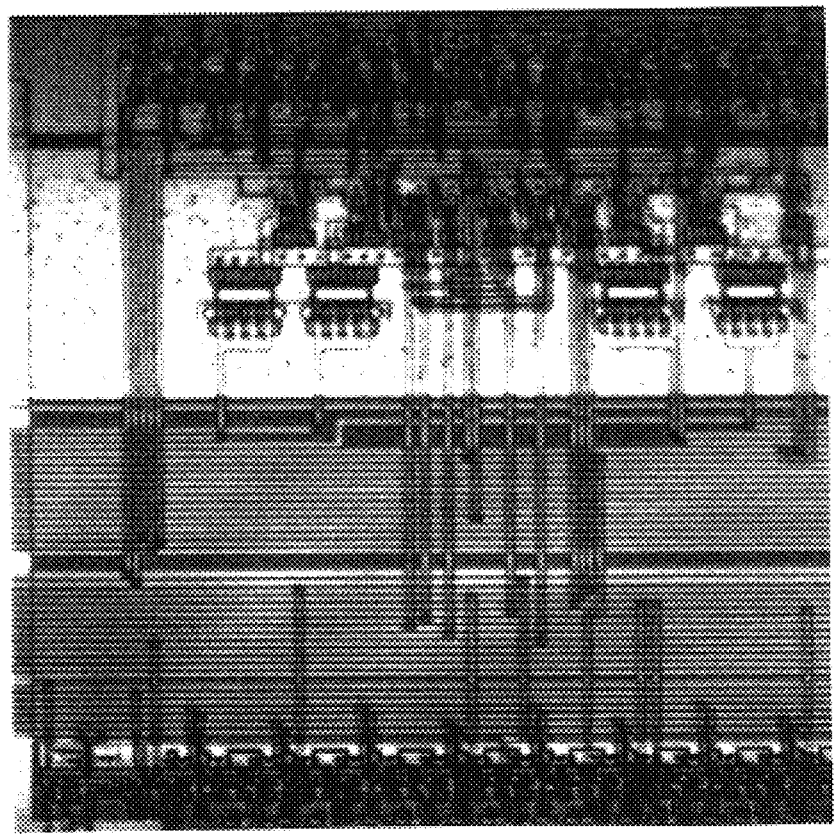
FIG. 3b shows a reflected-light image of the same scanned portion of the IC for registration.

FIGS. 3a and 3b show images obtained with the TIVA apparatus 10 of FIG. 1 for the device-side analysis of a simulated open-circuit defect in a radiation-hardened CMOS version of an Intel Corporation, Model 80C51 microcontroller fabricated using two levels of patterned conductors (i.e. a two-level metallization) with a 1.25-μm feature size process. The simulated open-circuit defect in the example of FIGS. 3a and 3b was produced in a first-level metallization using a focused ion beam to locally remove metal from one of the signal bus conductors. For analysis, the CMOS IC 100 was biased at a constant current of about 6 mA from the source 22 with the supply voltage being nominally 4.5 V. The laser 14 was operated at 1.34 μm wavelength with a power output of 120 mW.

FIG. 3a shows the location of the open-circuit defect (indicated by the arrow at the bottom of the light line which indicates the open-circuit electrical conductor) in a portion of the CMOS IC 100 raster scanned by focused laser beam 16. Initially, the entire CMOS IC 100 was scanned with the focused laser beam 16 to locate the open-circuit defect before performing the localized scan of FIGS. 3a and 3b. FIG. 3b shows a reflected-light image of the same portion of the IC for registration with FIG. 3a to precisely locate the open-circuit electrical conductor within the CMOS IC 100. Although FIGS. 3a and 3b are shown separately for clarity, these figures can be superposed by the image processor 32 for display as a composite image to allow a precise location of the open-circuit defect and open-circuit electrical conductor.

Figure 4A:
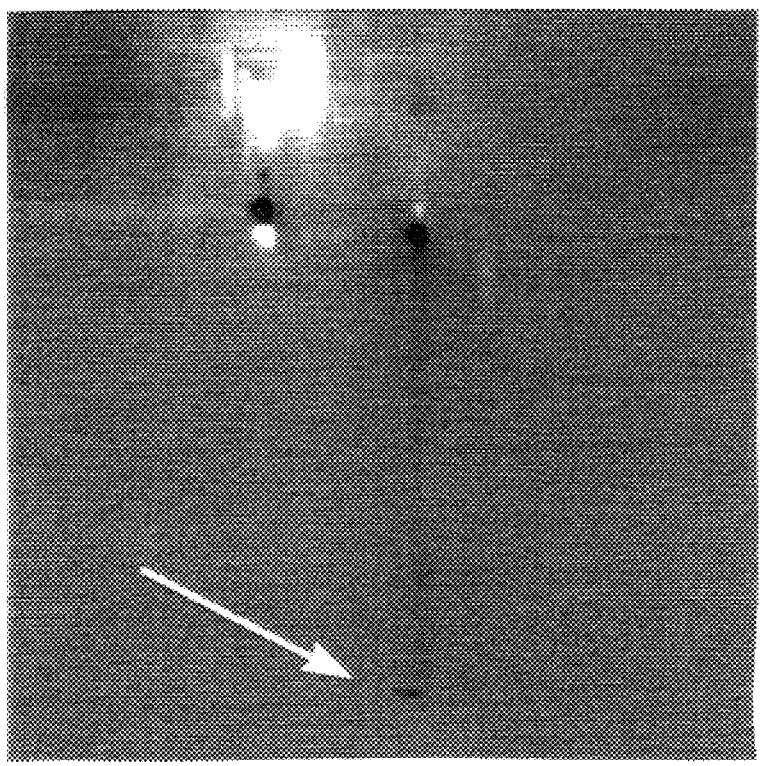
FIGS. 4a and 4b show images obtained from the same IC as in FIGS. 3a and 3b, but with substrate-side analysis using the TIVA apparatus and method of the present invention.
Figure 4B:
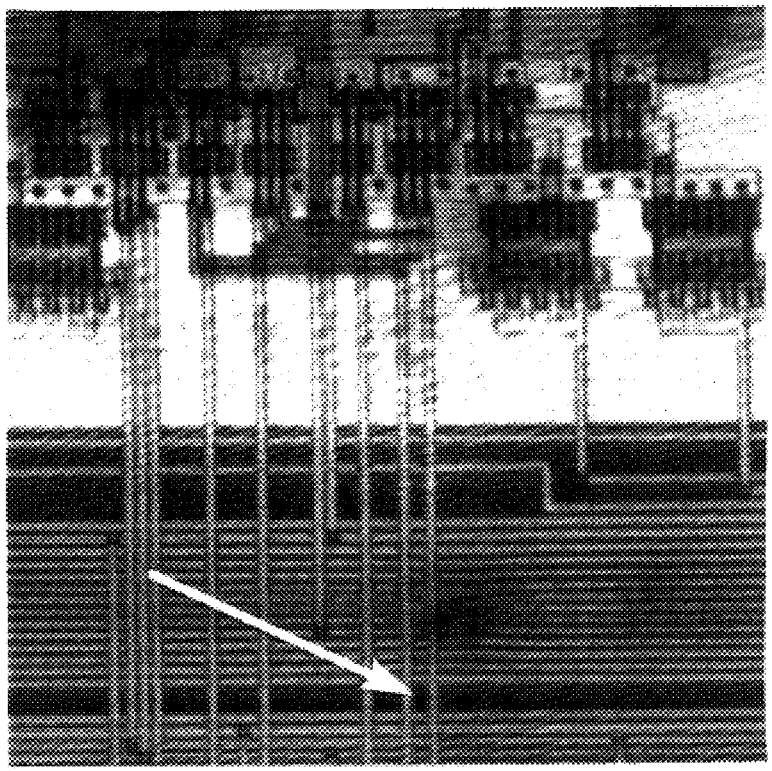

FIGS. 4a and 4b show images obtained from the same IC 100 and simulated open-circuit defect as in FIGS. 3a and 3b using the same operating conditions, but with substrate-side analysis using the TIVA apparatus 10 of FIG. 1. Since this IC 100 was packaged with the device side exposed (i.e. with the device side up), access to the substrate side of the IC was provided by potting the IC in epoxy and mechanically polishing away the bottom of the IC to expose the substrate side of the IC. Once the substrate-side of the IC 100 was exposed, no additional thinning of the IC substrate was performed.

In FIG. 4a, the open-circuit defect (indicated by the arrow) can be seen. The TIVA image in FIG. 4a was produced by averaging 16 images, with each image being formed by repetitively scanning each line in the image 16 times to improve a signal-to-noise ratio of the image. The signal acquisition time for the 512-line image (with 512 pixels per line) in FIG. 4a was 2048 seconds (16 images averaged×128 seconds/image for repetitively scanning each line in the image 16 times). At the top of FIG. 4a, a relatively strong image contrast is produced at interconnections between the open-circuited metal conductor and polysilicon electrical conductors, with a dark image being produced at a metal-polysilicon interface, and with a light image being produced by a polysilicon-metal interface. These images are thought to be due to thermocouple effects at the interfaces between the dissimilar materials, with the type of image (i.e. light or dark) that is produced depending on a sign of the thermoelectric potential at each interface (i.e. depending on whether the thermoelectric potential is positive or negative, thereby turning transistors on or off and increasing or decreasing the power demand of the IC 100).

FIG. 4b shows a reflected-light image produced through the substrate using the focused and scanned 1.34-μm laser beam 16 of the TIVA apparatus 10 of FIG. 1. In FIG. 4b, the location of the open-circuit defect due to a break in the metal conductor is shown by the arrow. Even with relatively poor polishing of the substrate side of the IC 100, the open-circuit defect can be identified by correlating the TIVA image of FIG. 4a with the reflected-light image of FIG. 4b.

Figure 5A:
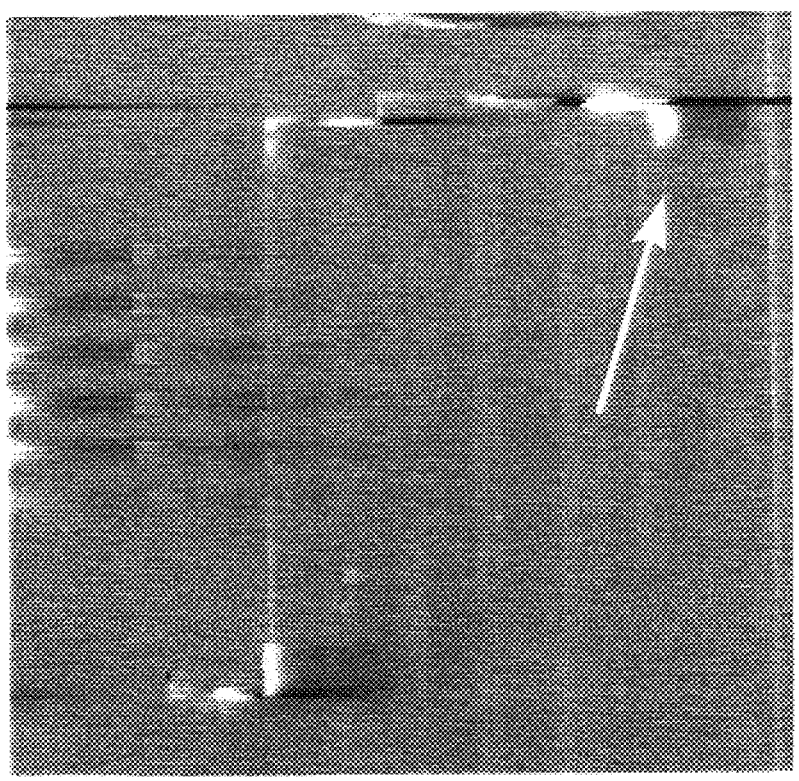
FIG. 5a shows an image of an open-circuit defect in another CMOS IC obtained with the TIVA apparatus using substrate-side irradiation.
Figure 5B:
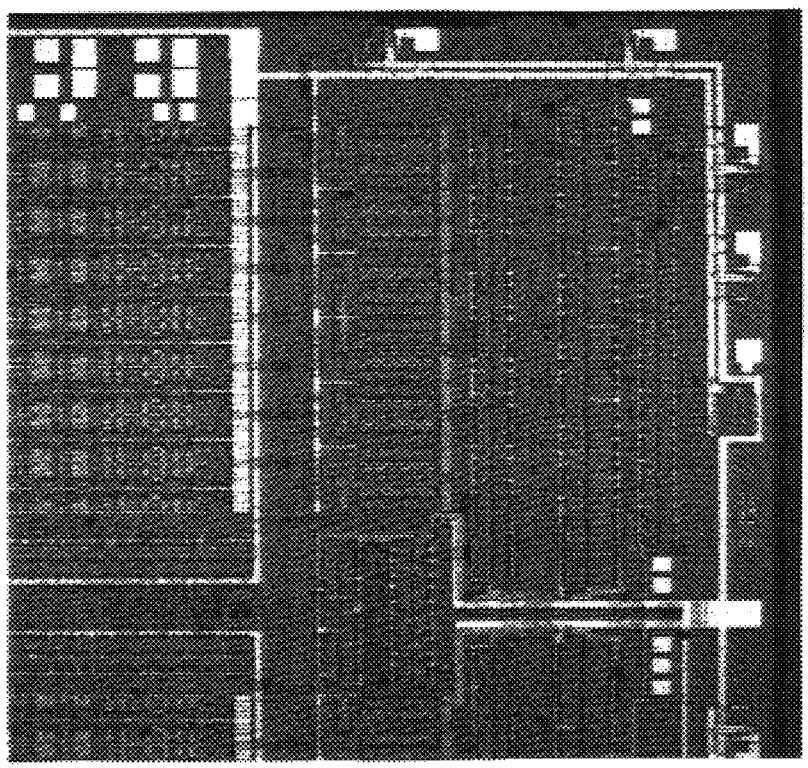
FIG. 5b shows a reflected-light image obtained through the substrate for the same scanned portion of the IC for registration.

FIGS. 5a and 5b show images obtained with the TIVA apparatus 10 of FIG. 1 for substrate-side analysis of a low power CMOS application specific IC (ASIC) 100 fabricated using a 4-μm metal and 3-μm polysilicon process. For analysis, this IC 100 was operated at a constant current of 70 μA and a variable voltage of about 4.9 V. The laser 14 was operated at 1.34 μm wavelength and 120 mW power.

A simulated open-circuit defect in the form of a floating electrical conductor was produced using high-power laser ablation of metal from the conductor at a point or site in the IC 100 indicated by the arrow. Since this IC was packaged with the device side exposed (i.e. with the device side up), access to the substrate side of the IC was provided by potting the IC in epoxy and mechanically polishing away the bottom of the IC to expose the substrate side of the IC. Once substrate-side of the IC 100 was exposed, no additional thinning of the IC substrate was performed.

In FIG. 5a, the TIVA apparatus 10 using the focused and scanned laser beam 16 provides an image (indicated in FIG. 5a by the connected light-colored lines against a darker background) of the open-circuit floating electrical conductor. The entire open-circuit or floating electrical conductor can be seen in FIG. 5a from the location of the open-circuit defect (indicated by the arrow) to a connection of the conductor to a gate of a driven transistor located at the bottom left-hand side of FIG. 5a. FIG. 5b shows a reflected-light image obtained through the substrate for the same portion of the IC 100 as shown in FIG. 5a for use in locating the open-circuit defect and floating conductor within the IC 100.

Figure 6A:
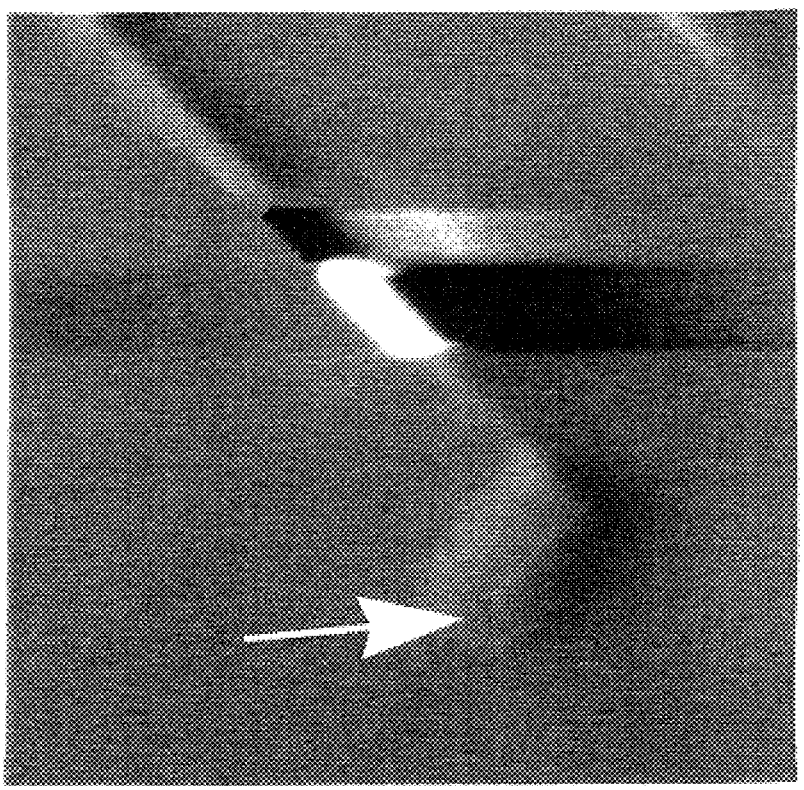
Figure 6B:
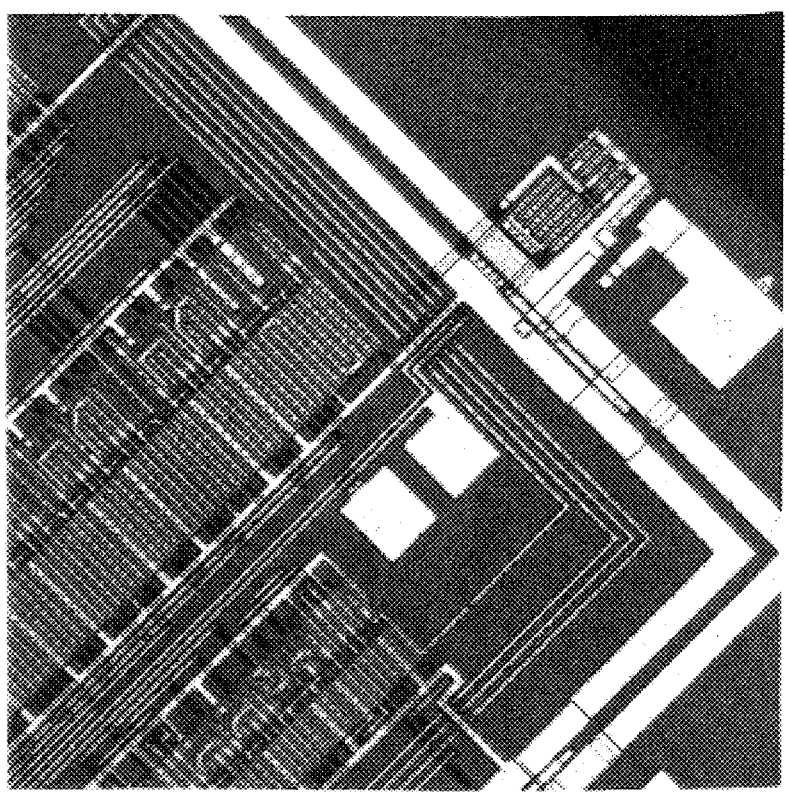
FIG. 6b shows the scanned portion of the IC containing the defect.

FIGS. 6a and 6b show at higher magnification (and rotated at a 45° angle) the open-circuit defect produced by laser ablation in FIGS. 5a and 5b, respectively. The biasing and laser irradiation conditions for the IC 100 in FIGS. 6a and 6b are the same as those of FIGS. 5a and 5b. The TIVA image of the open-circuit defect in FIG. 6a using substrate-side irradiation was produced by averaging 4 images, with each image being formed by scanning over each line in the image 16 times to improve a signal-to-noise ratio of the image. The signal acquisition time for each 512 line image (with 512 pixels per line) was 512 seconds (4 images averaged×128 seconds/image for repetitively scanning each line in the image 16 times). In the absence of line averaging, typical scan times for each image can range from about 4 to 8 seconds.

In FIG. 6a, the contrast of the TIVA image of the open-circuit floating electrical conductor can be seen to be affected by the amount of localized heating produced by the focused laser beam 16. The bright (i.e. white) portion of the TIVA image in FIG. 6a with a high contrast is produced where the electrical conductor is thermally insulated from the underlying substrate by a layer of insulating field oxide (i.e. silicon dioxide) and a p-well region of transistor logic gates. The irradiation by the focused laser beam 16 produces an increased localized heating of the thermally insulated portion of the conductor, thereby producing a larger thermoelectric potential and an increase in the amplified voltage signal 50 as compared to the remaining portion of the conductor which is in thermal contact with the underlying substrate. Additionally, absorption of the focused laser beam 16 by the silicon substrate adjacent to the open-circuit floating conductor locally heats the silicon substrate with the heating being transferred laterally to the conductor which is in thermal contact with the substrate. With no intervening structures (i.e. transistors) to absorb the heat, this results in heating of the floating electrical conductor by lateral heat transfer, thereby broadening the TIVA image of the open-circuit floating conductor. This effect is most pronounced in FIG. 6a near the open-circuit defect as indicated by the arrow.

Figure 7A:
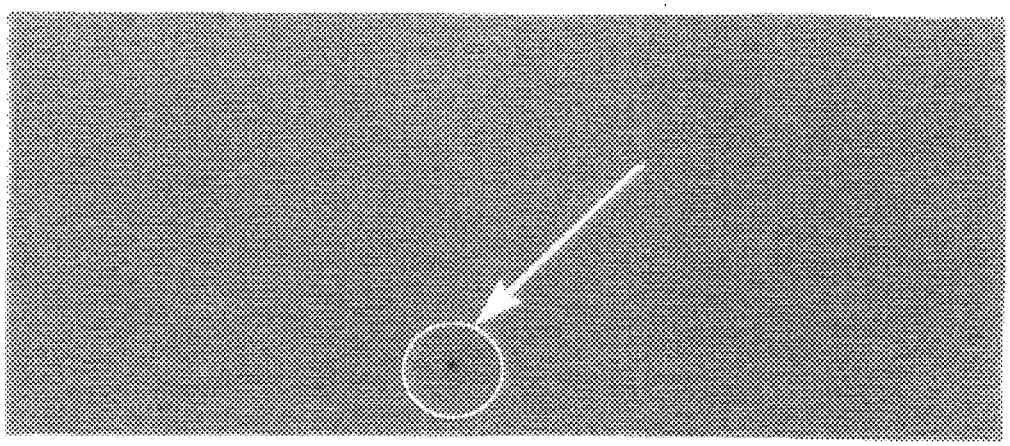
FIG. 7a shows a device-side TIVA image of an entire 1 Mb SRAM IC with the location of a short-circuit defect indicated by the arrow and circle.
Figure 7B:
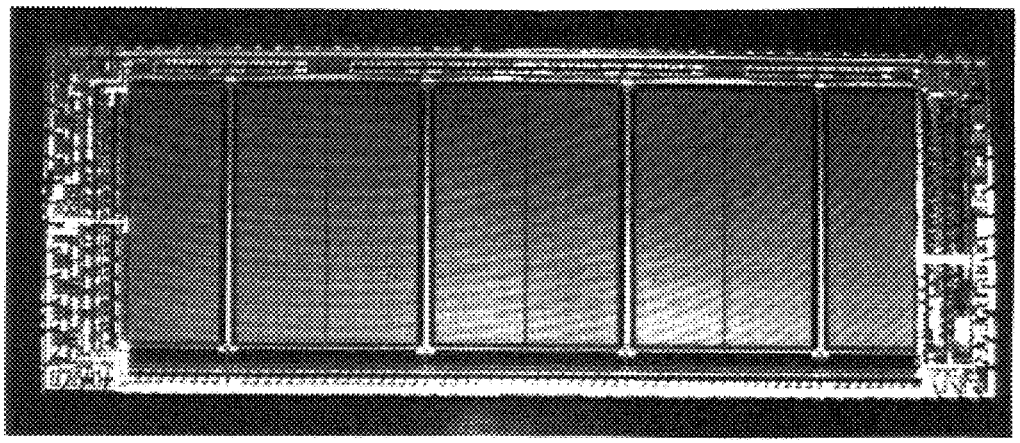
FIG. 7b shows a reflected-light image of the SRAM IC.

FIGS. 7a and 7b show the utility of the present invention for analyzing an entire IC die in a single image for qualification testing or failure analysis. FIGS. 7a and 7b show, respectively, a device-side TIVA image of an entire 3-level metal, 0.5-μm feature size, 1 megabyte (Mb) static random access memory (SRAM) IC 100, and a reflected-light image of the IC 100. For analysis, this IC 100 was biased at a constant current of 15 mA and a variable voltage of about 4.9 V, with the laser 14 being operated at 1.34 μm wavelength with 120 mW of power. The TIVA apparatus 10 of FIG. 1 was used to locate a short-circuit defect within the SRAM IC 100 as shown in FIG. 7a by the dark spot indicated by the white circle and arrow. Once the short-circuit defect has been located by scanning the entire SRAM IC 100, a smaller portion of the IC can be scanned to precisely locate the defect.

Figure 8A:
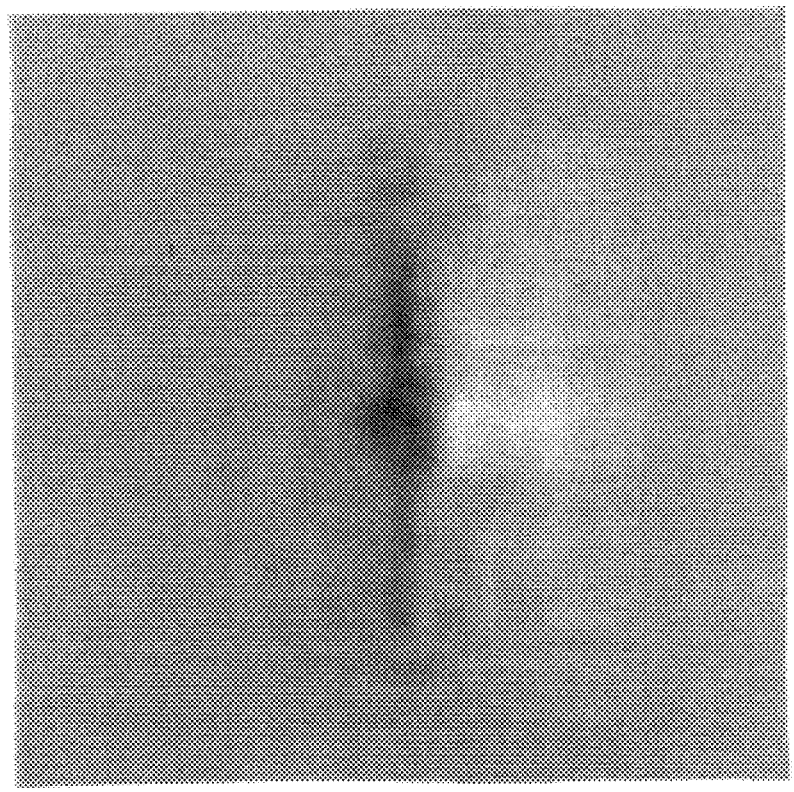
Figure 8B:
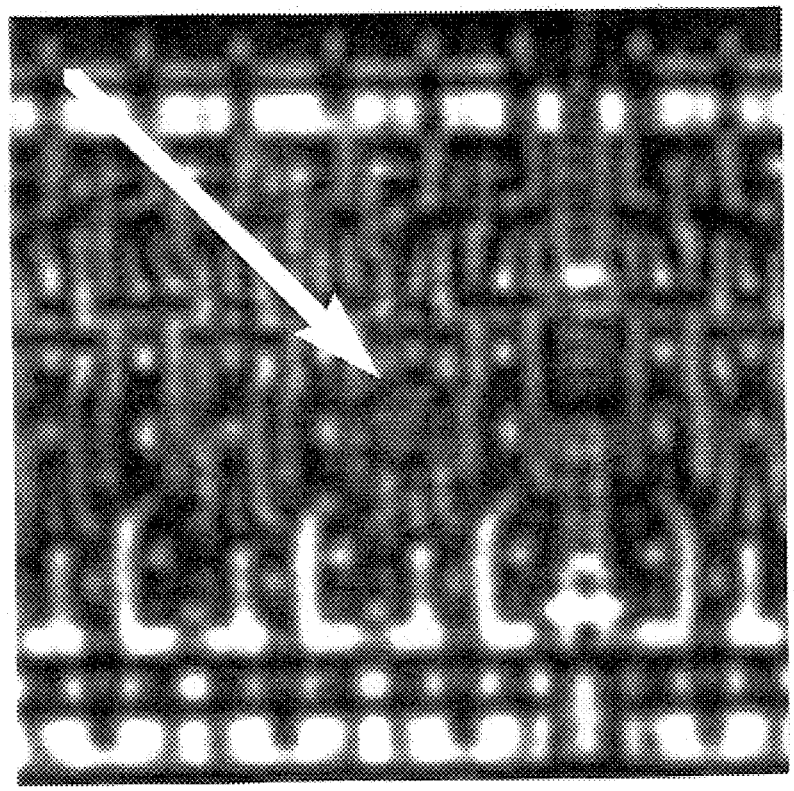
FIG. 8b shows a corresponding reflected-light image of that portion of the IC showing the defect.

FIG. 8a shows an enlarged TIVA image of the portion of the SRAM IC 100 surrounding the short-circuit defect in FIG. 7a; and FIG. 8b shows a corresponding reflected-light image of the same portion of the IC 100 for registration. The operating conditions for FIGS. 8a and 8b are the same as those of FIGS. 7a and 7b. A blurring of the reflected-light image in FIG. 8b is due to the focused and scanned laser beam 16 which has a wavelength of 1.34 μm that is substantially larger than the 0.5-μm feature size of the SRAM IC 100 being tested. Once the location of the short-circuit defect was determined using the TIVA apparatus 10, the short-circuit defect was determined to be a stainless steel particle (indicated by the arrow in FIG. 8b) that was shorting two adjacent signal lines.

Figure 9A:
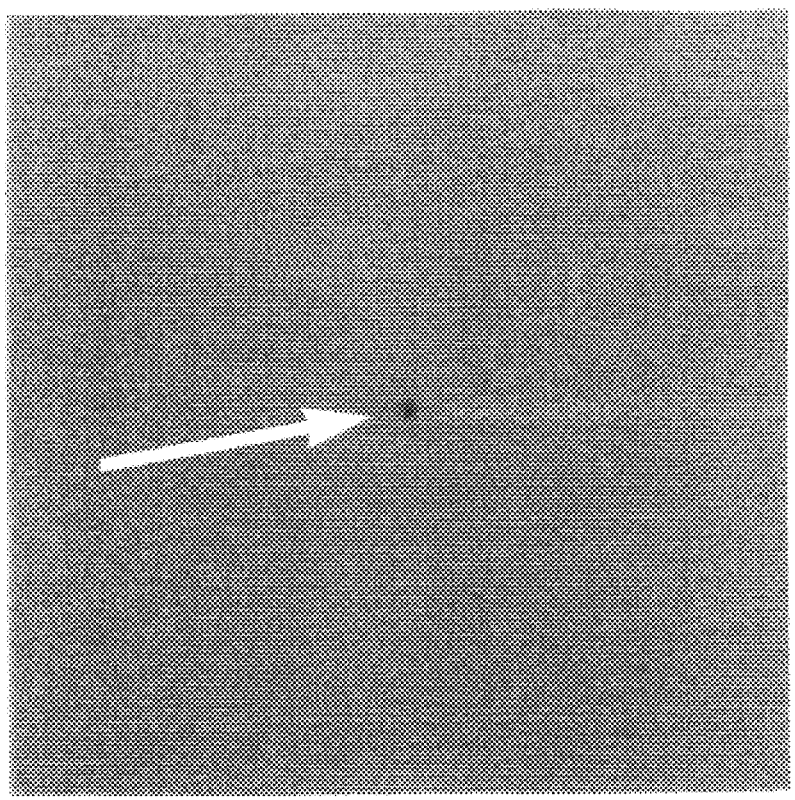
FIGS. 9a and 9b show, respectively, a device-side TIVA image and a corresponding reflected-light image of another 1 Mb SRAM IC for locating a short-circuit defect therein.

FIG. 9a shows a device-side TIVA image of another 1 Mb SRAM IC 100 biased at a constant current of 4 mA and a variable source voltage near 4.6 volts. The variation in the supply voltage ($V_{DD}$) indicating the location of a short-circuit defect in FIG. 9a was about 0.3 mV before amplification. This voltage change was produced with the focused and scanned laser beam 16 from the 120 mW, 1.34 μm laser 14. The particle responsible for the short-circuit defect can be clearly seen in the corresponding reflected-light image in FIG. 9b, although the individual electrical conductors short-circuited by the particle are not resolved. The short-circuiting particle was also found to be a stainless steel particle that bridged across adjacent conductors in the IC 100.

Figure 9B:
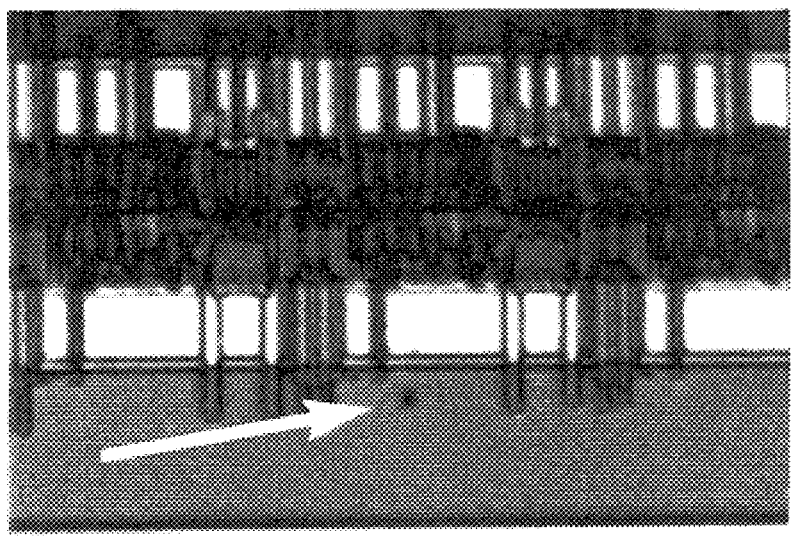
Figure 9B:
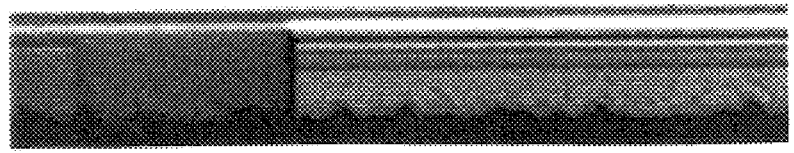
Figure 10A:
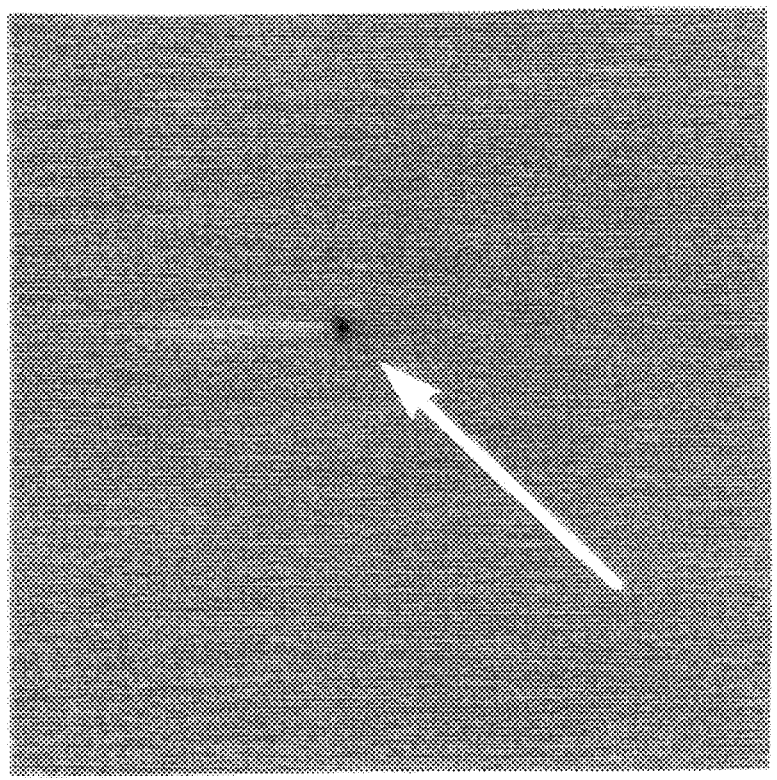
FIGS. 10a and 10b show, respectively, a TIVA image and a reflected-light image of the SRAM IC of FIGS. 9a and 9b using substrate-side irradiation with the TIVA apparatus and method of the present invention.
Figure 10B:
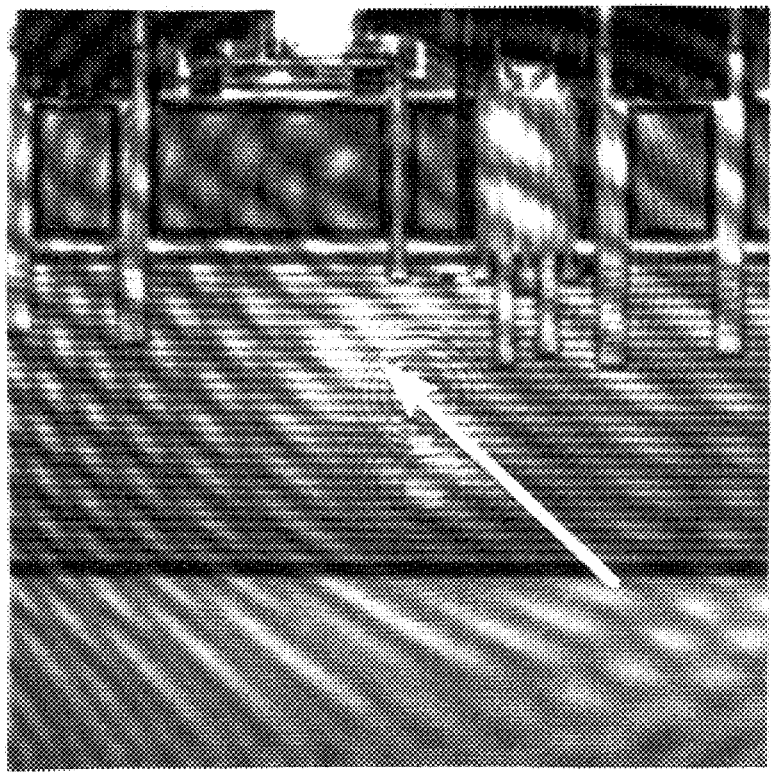

FIGS. 10a and 10b show, respectively, a TIVA image and a reflected-light image of the same SRAM IC 100 and short-circuit defect of FIGS. 9a and 9b at higher magnification using substrate-side irradiation with the focused and scanned laser beam 16. In FIGS. 10a and 10b, the same biasing and laser operating conditions were used as for FIGS. 9a and 9b. The SRAM IC 100 was prepared for substrate-side TIVA analysis using the apparatus 10 of FIG. 1 by sealing the device side of the IC with epoxy and then exposing the substrate side of the IC 100 by mechanical polishing. In FIG. 10a, the short-circuit defect is located using substrate-side irradiation; and its location is pinpointed by the arrow. The reflected-light image in FIG. 10b is at higher magnification, and also has been contrast enhanced by the image processor 32 so that the individual electrical conductors can be identified. In FIG. 10b, the short-circuiting particle is not visible since it is located beneath the electrical conductors on the device side of the substrate.

The variation in voltage of the constant-current source 22 produced by the focused and scanned laser beam 16 can be further increased by increasing the laser beam power above the 120 mW used for the foregoing examples. Additionally, in some embodiments of the present invention, the laser 14 can be modulated or pulsed (e.g. at a 1 MHz pulse repetition rate produced, for example, by positioning an electro-optic or acousto-optic modulator in the path of the laser beam 16 or within the laser 14) to produce the localized heating within the IC 100 being tested. The use of a modulated or pulsed laser beam 16 is advantageous in that it further allows the use of lock-in amplification or gated detection techniques to process the variation in supply voltage from the constant-current source 22, thereby further improving a signal-to-noise ratio in the image produced by the TIVA apparatus 10 of FIG. 1.

The TIVA apparatus 10 of FIG. 1 can also be applied to the analysis of MEM devices 100. Electrical short-circuiting of MEM devices is a significant production and manufacturing concern. The TIVA apparatus 10 of the present invention provides a rapid and efficient method for analyzing such MEM devices 100 in contrast to the use of optical microscopy or scanning electron microscopy both of which are arduous and time consuming. After analysis using the TIVA apparatus 10, the type of defect producing the short-circuit can be determined so that a decision can be made about whether the defect is correctable (e.g. by post processing).

In the case of a MEM device 100 having on-board integrated circuitry for sensing or control of the MEM device 100 (e.g. an integrated MEM accelerometer), the TIVA apparatus 10 of FIG. 1 can be used to detect open-circuit and short-circuit defects in the integrated circuitry in a manner similar to that described previously with reference to FIGS. 3–10. Additionally, the TIVA apparatus of FIG. 1 can be used to detect short-circuit defects in the structure of the MEM device 100. Since the electrically-active members of the MEM device 100 are generally suspended above the substrate for movement and therefore are thermally isolated from the substrate, a relatively large thermoelectric potential can be generated upon heating by the focused laser beam 16 similar to that described previously for the thermally insulated electrical conductor in FIG. 6a.

Figure 11A:
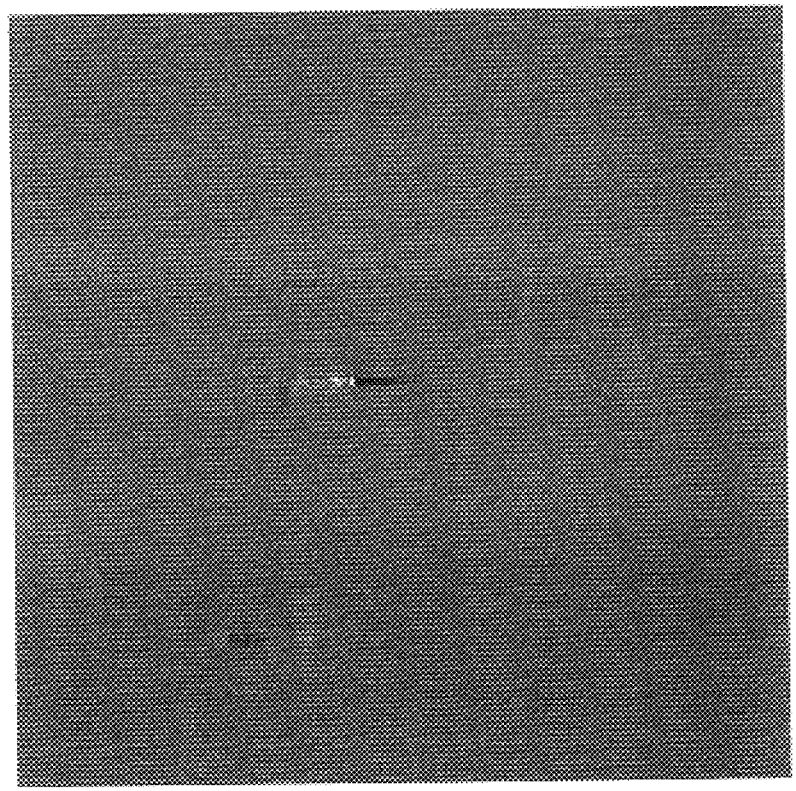
FIG. 11a shows a TIVA image of a short-circuit defect in a MEM device using top-side laser irradiation.
Figure 11B:
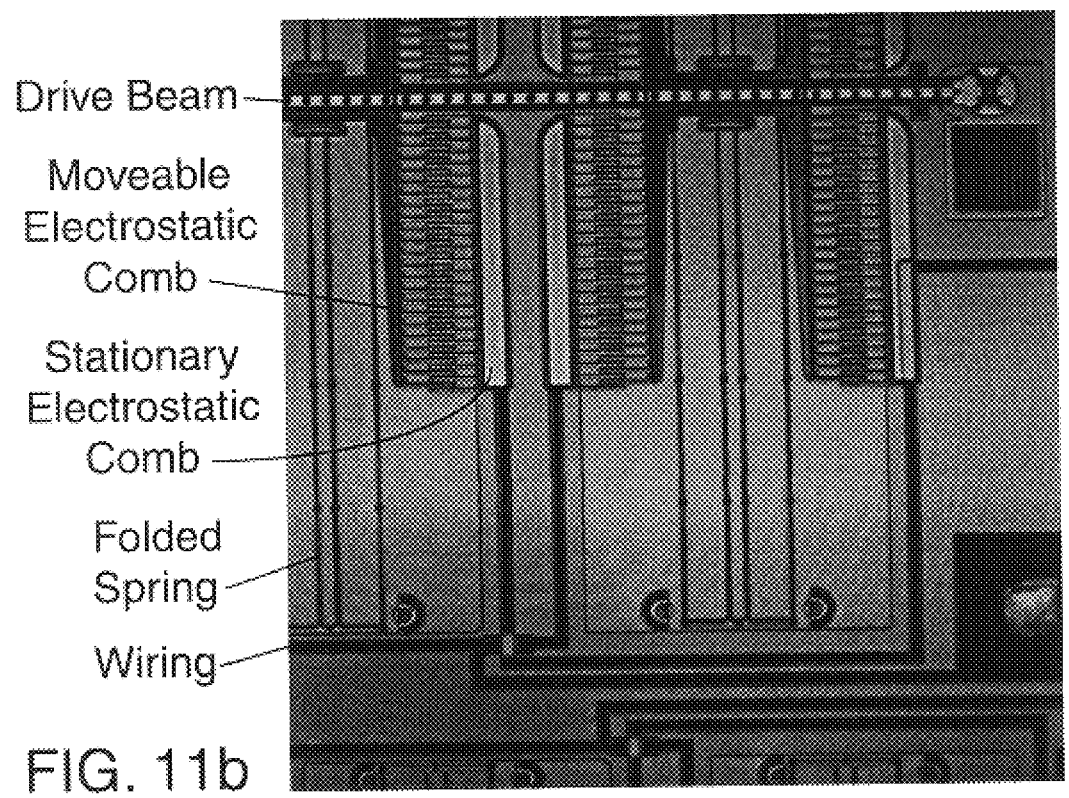
FIG. 11b shows a reflected-light image of the same scanned portion of the MEM device which is an electrostatic comb actuator.

FIG. 11a shows a TIVA image of a short-circuit defect in a MEM device using top-side laser irradiation. The portion of the MEM device 100 being irradiated with the focused laser beam 16 is shown in the reflected-light image of FIG. 11b. This device 100 is an electrostatic comb actuator which comprises a plurality of stationary electrostatic combs enmeshed with moveable electrostatic combs which are suspended above the substrate by folded springs. Each electrostatic comb comprises a plurality of spaced fingers about 2 μm wide which overlie the substrate and which are effectively thermally isolated from the substrate. The moveable electrostatic combs are generally maintained at ground electrical potential (i.e. the same electrical potential as the substrate); and an actuation voltage is applied to the stationary electrostatic combs through wiring that is electrically insulated from the substrate. Application of the actuation voltage between the stationary and moveable electrostatic combs produces an electrostatic force of attraction that urges the combs together to produce a mechanical movement of the moveable electrostatic combs which are each supported on a central drive beam which runs horizontally in FIG. 11b. This mechanical movement, which can be oscillatory, can then be used to provide functionality for many different types of MEM devices 100, including micromotors (i.e. microengines) and ratchet actuators. Further details of an electrostatic comb actuator and a micromotor based on the use of such actuator can be found, for example, in U.S. Pat. No. 5,631,514 which is incorporated herein by reference.

In operation, the electrostatic combs act as plates of a capacitor with no direct current flow between the electrostatic combs. Thus, any short-circuit defect in the MEM device 100 can be detrimental to device operation and can even lead to destruction of the device due to the large actuation voltages (up to about 100 volts) which can give rise to a substantial current flow between short-circuiting electrically-active members (e.g. contacting fingers of opposing electrostatic combs) of the MEM device 100.

The TIVA image in FIG. 11a was generated by operating the constant-current source at about 1 μA current, and by using a helium-neon (He—Ne) laser operating at a wavelength of 543 nanometers with 5 milliwatts of cw output power in the laser beam 16. This output power level is much lower than that used for analyzing ICs as described previously with reference to FIGS. 3–10. This reduced power level is due to the increased absorptivity of polycrystalline silicon (also termed polysilicon), which was deposited and patterned as a plurality of stacked and interconnected layers to form the MEM device 100, at this lower wavelength of 543 nanometers, and is also due to the increased thermal isolation of the MEM device 100 which is largely suspended above the substrate and separated therefrom by an air gap. In some instances (e.g. for members of a MEM device 100 which are designed to be in intimate contact with each other) a higher power level (up to about a few hundred mW) can be required to generate the TIVA image.

In FIG. 11a (and also for the other TIVA images described hereinafter) the TIVA image is in the form of a 512×512 pixel scan obtained by scanning the laser beam 16 over the MEM device 100 at a rate of eight seconds per frame and averaging each scanned line eight times using the image processor 32. The irradiated portion of each MEM device 100 in these examples is thus imaged over a time period of about one minute to provide an image of high quality. Each reflected-light image can be generated during the same time as the TIVA image. The exact scan rate to be used will, in general, depend upon several factors, including the power level and spot size of the focused laser beam 16, the size of the irradiated portion of the MEM device 100, and the desired image quality.

The TIVA image in FIG. 11a shows that a lowermost finger of one of the stationary electrostatic combs is in contact with the underlying substrate thereby producing an electrical short circuit between an unsupported end of this finger and the underlying substrate. This can be seen better in FIGS. 12a and 12b which are enlarged views of FIGS. 11a and 11b, respectively. In FIGS. 12a and 12b, the location of the short-circuit defect can be easily identified from the TIVA image of FIG. 12a and the reflected-light image of FIG. 12b. Although these images are shown separately, the TIVA apparatus 10 can present these images superposed as a composite image for rapidly determining the location of any short-circuit defects in the MEM device 100. The most likely cause for the short-circuit defect in this example is due to stiction. Once identified and located, a short-circuit defect due to stiction can be eliminated to restore the MEM device 100 to full functionality by post processing. Such post processing can be, for example, a cleaning step followed by an anti-stiction treatment such as applying a stiction-reducing coating or using a stiction-free drying method as known to the art. Once the post processing has been completed, the MEM device 100 can be examined again using the TIVA apparatus 10 to verify that the short-circuit defect has been eliminated. Since analysis with the TIVA apparatus 10 is nondestructive, the yield for fabricating MEM devices can be increased by using the apparatus 10 for qualification testing, with any MEM devices 100 that show short-circuit defects being post processed and reexamined.

Figure 13A:
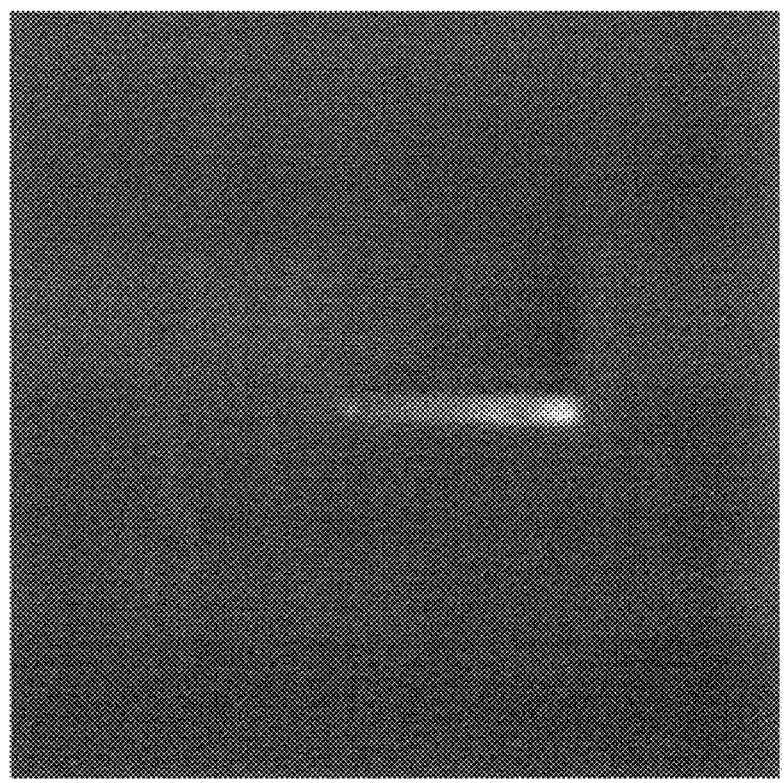
FIG. 13a shows a TIVA image of a short-circuit defect in a second electrostatic comb actuator using top-side laser irradiation.
Figure 13B:
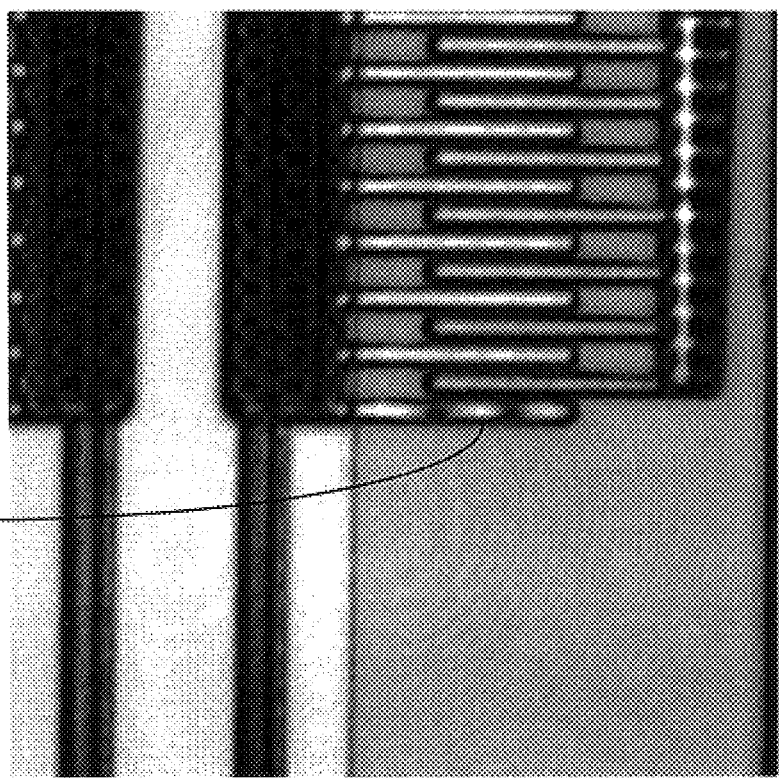
FIG. 13b shows a reflected-light image of the same scanned portion of the MEM device indicating that the short-circuit defect is due to a majority of the lowermost finger of the stationary comb being in contact with the underlying substrate.

FIGS. 13a and 13b show results for location of another short-circuit defect in a second electrostatic comb actuator using top-side laser irradiation with about 4 mW of 1.32 μm laser irradiation from a cw Nd:YAG laser focused to a spot size about equal to the wavelength. In this example, the lowermost finger of the stationary electrostatic comb is also seen to be responsible for the short-circuit defect. However, from the TIVA image, the area of contact between the short-circuiting finger and the underlying substrate is shown to be much larger than that of FIG. 12a. Thus, the TIVA apparatus 10 is useful for not only locating the short-circuit defect, but also determining the extent of the defect. The reflected-light image formed using the coherent laser beam 16 also indicates that the lowermost finger of the stationary electrostatic comb is bent downward by the presence of interference fringes which appear as dark spots on the finger. The remaining fingers, which do not show such interference fringes, are seen to be undeflected (i.e. coplanar) in FIG. 13b. The short-circuit defect identified and located using the TIVA apparatus 10 in FIGS. 13a and 13b can also be attributed to stiction. The 1.32 μm Nd:YAG laser 14 or alternately a Nd:YVO$_4$ laser 14 can be used to analyze the MEM device 100 through the silicon substrate although this may require a slight increase in the laser output power due to light absorption by the substrate.

Figure 14A:
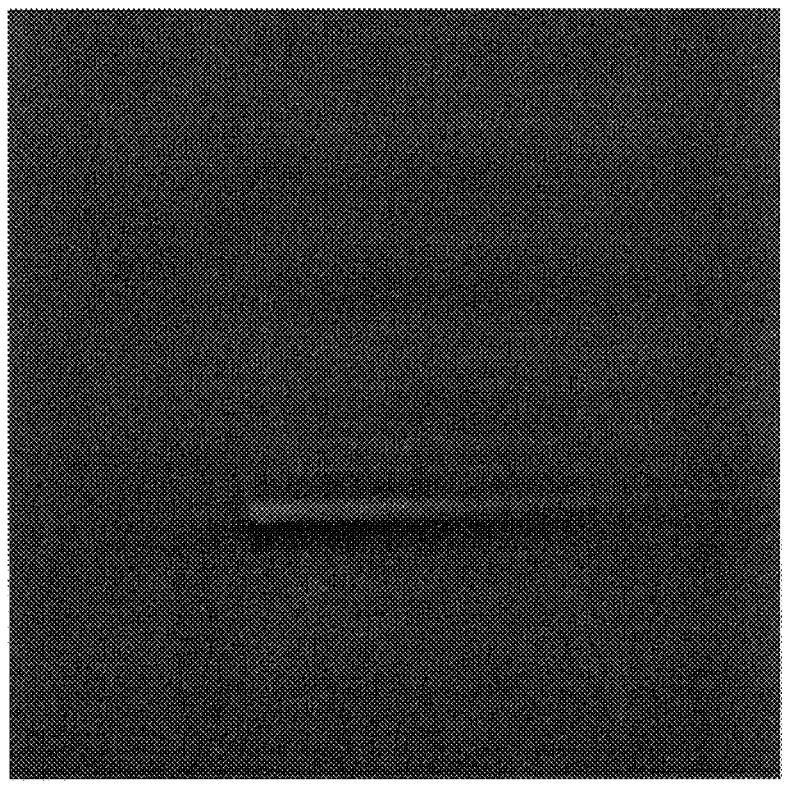
FIG. 14a shows a TIVA image of a short-circuit defect in a third electrostatic comb actuator using top-side laser irradiation.
Figure 14B:
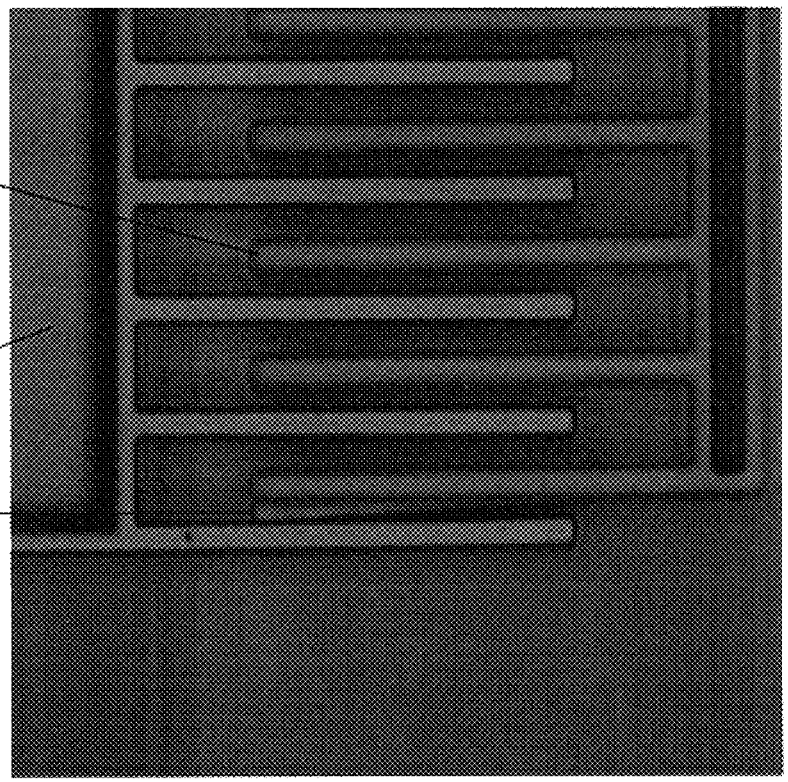
FIG. 14b shows a reflected-light image of the same scanned portion of the MEM device indicating that the short-circuit defect is due to contact between adjacent fingers of the electrostatic comb actuator.

FIGS. 14a and 14b show another type of stiction-related short-circuit defect that can be identified and located using the TIVA apparatus of the present invention. The TIVA image of FIG. 14a in this example allows rapid location of the short-circuit defect in combination with the reflected-light image of FIG. 14b. The short-circuit defect can be seen from FIG. 14b to be due to a lateral movement of a lowermost finger of the moveable electrostatic comb (on the right-hand side of FIG. 14b) to bring this finger into contact with the lowermost finger of the stationary electrostatic comb (on the left-hand side of FIG. 14b). Since each electrostatic comb is formed from a plurality of stacked polysilicon layers, this contact and short-circuiting appears in FIG. 14b to be due to a twisting of the lowermost finger of the moveable electrostatic comb as a result of stiction. Once identified, the stiction-related short-circuit defect can be subjected to post processing as described previously in an attempt to eliminate the defect and restore the MEM device 100 to full functionality.

Figure 15A:
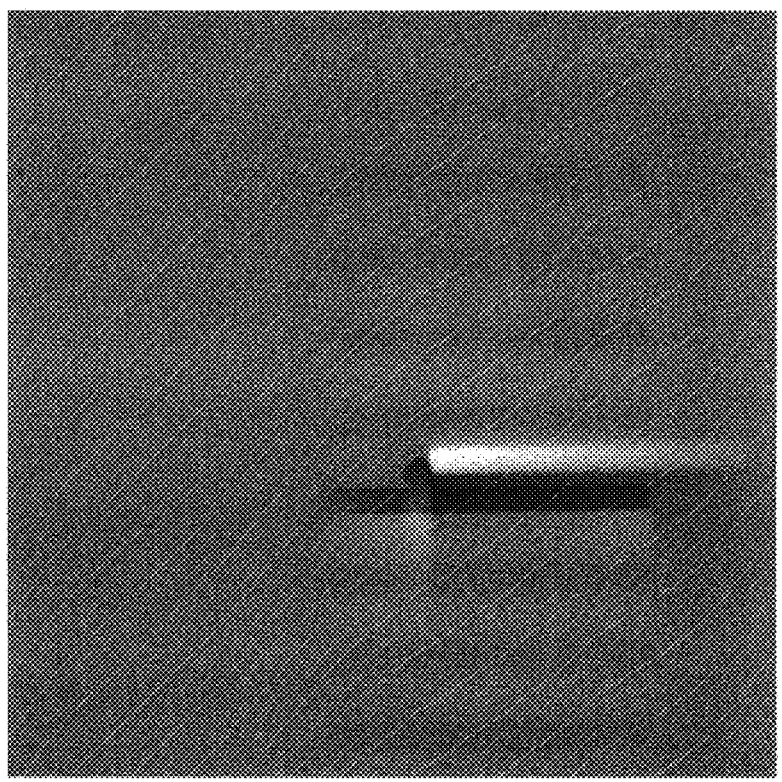
FIG. 15a shows a TIVA image of a short-circuit defect in a fourth electrostatic comb actuator using top-side laser irradiation.
Figure 15B:
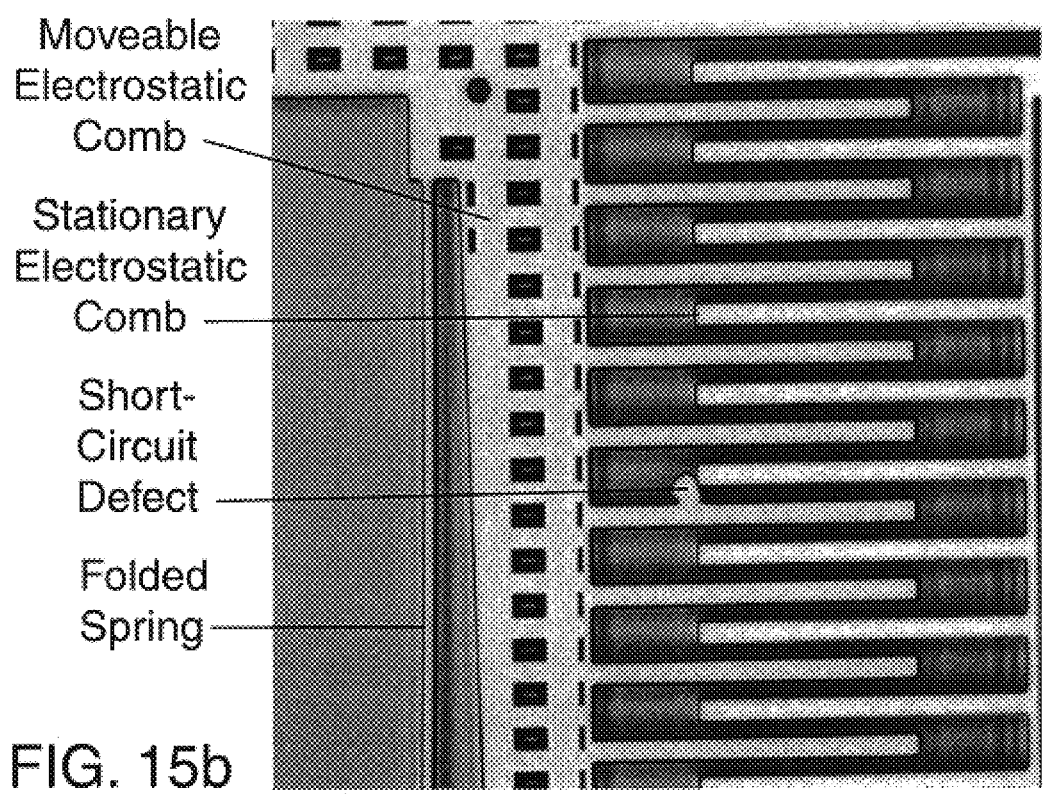
FIG. 15b shows a reflected-light image of the same scanned portion of the MEM device indicating that the short-circuit defect is due to a manufacturing defect which results in a short-circuit being formed between a pair of fingers of the electrostatic comb actuator.

FIGS. 15a and 15b show results for measurement of a fourth electrostatic comb actuator using the TIVA apparatus 10 of the present invention. In FIG. 15a, a TIVA image is generated using top-side laser irradiation from a He—Ne laser 14 operating at 543 nanometers with an output power of about 5 mW. In this MEM device 100, the short-circuit defect located by the TIVA apparatus 10 was found to be a manufacturing defect which resulted in a malformed finger on one of the moveable electrostatic combs. As shown in the reflected-light image of FIG. 15b, the short-circuit defect is due to a polysilicon tit extending laterally outward from one of the fingers of the moveable electrostatic comb to contact an opposing finger of the stationary electrostatic comb. This manufacturing defect is presumably due to particle contamination which prevented complete patterning of the affected finger during a reactive ion etching step. This is an example of a short-circuit defect identifiable with the TIVA apparatus 10 which cannot be corrected by post processing.

In the TIVA image of FIG. 15a, each finger giving rise to the short-circuit defect can be seen, with one finger producing a light image and with the other finger producing a dark image. As described previously, this image contrast is believed to depend upon the positive or negative sign of the thermoelectric potential on either side of a thermocouple produced by the short-circuit defect. The induced voltage (i.e. the thermoelectric potential) affects current flow through the short-circuit defect thereby altering the power demand of the MEM device 100 and changing the voltage provided by the constant-current source 22, which is generally operated at a constant current in the range of 1 μA–1 mA. This changing voltage can be routed from the MEM device 100 through the electrical connections 26 to the indicating means 30 which senses the changing voltage of the constant-current source 22 and the position of the focused and scanned laser beam 16 to generate the TIVA image for detecting any short-circuit defects in the MEM device 100.

When using the TIVA apparatus 10 of the present invention for analyzing MEM devices 100 without on-board integrated circuitry, the thermoelectric potential (also termed herein an induced voltage) generated upon localized heating of any short-circuit defects, which act as thermocouples, can be used directly to indicate the location of the defects without any need to supply power to the MEM device 100 through the constant-current source 22. This can be done using a modified TIVA apparatus 10 shown schematically in FIG. 16 which omits the constant-current source 22. In the TIVA apparatus 10 of FIG. 16, the induced voltage produced by laser irradiation of each short-circuit defect can be directly sensed after being routed through the switch matrix 24 and voltage amplifier 28 to the indicating means 30 which also senses the position of the focused and scanned laser beam to generate the TIVA image. This induced voltage for a MEM device 100 can be much larger than that observed for an IC device 100 due to the increased thermal isolation of the MEM device 100 which results in larger temperature gradients upon laser irradiation in the absence of any heat sinking of the MEM device 100 to the underlying substrate. The various elements of the TIVA apparatus 10 of FIG. 16 have been described previously with reference to FIG. 1.

Figure 16:
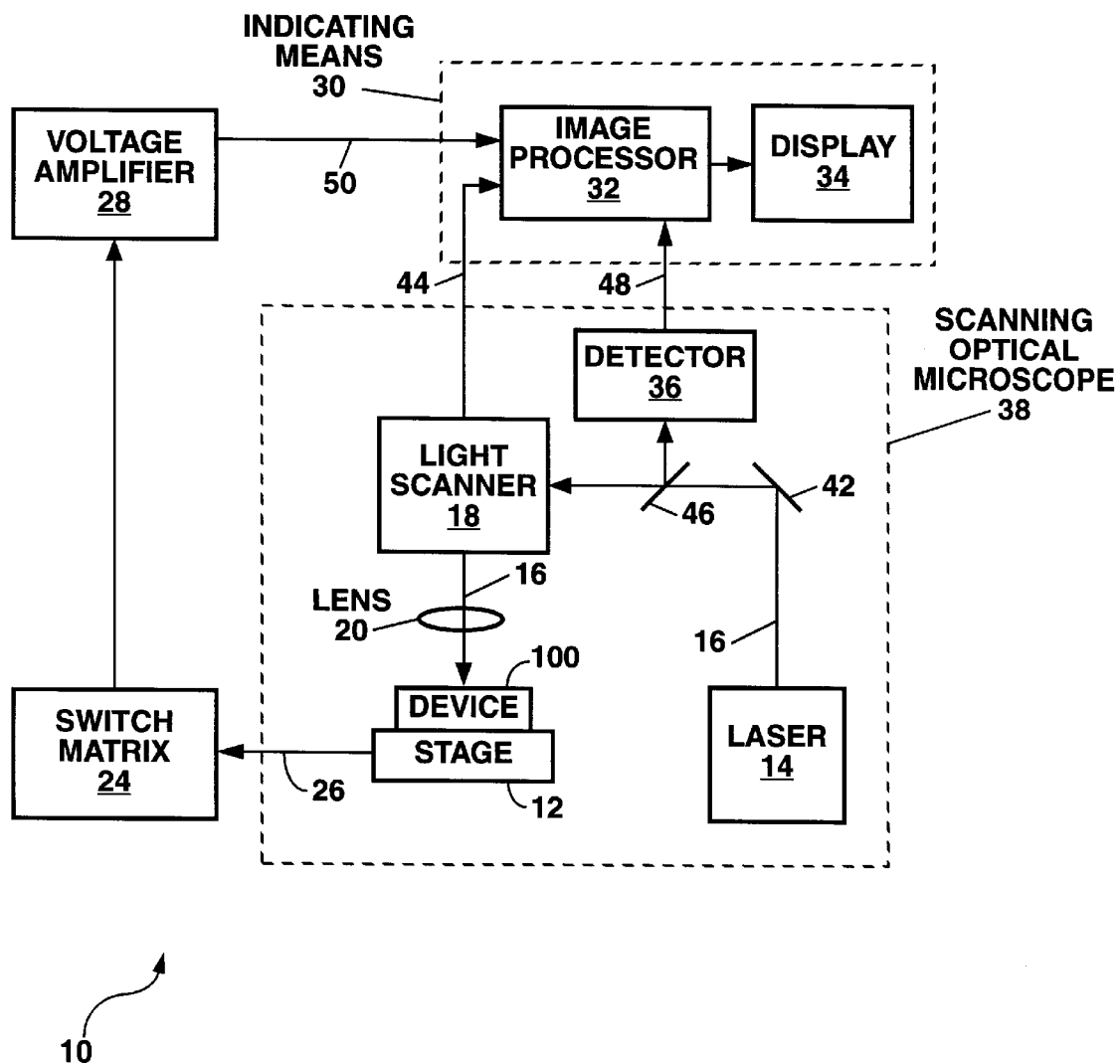
FIG. 16 shows a schematic representation of another embodiment of the TIVA apparatus of the present invention which does not include a constant-current source.

In FIG. 16, the switch matrix 24 needs only to select among a plurality of electrical connections to the MEM device 100 without providing electrical power to the device 100. For simple MEM devices 100 as shown in the examples of FIGS. 11–15, the switch matrix 24 can be operated manually or omitted altogether; whereas for more complicated MEM devices 100 having, for example, a plurality of electrostatic comb actuators on a common substrate, computer control of the switch matrix 24 can be used.

The voltage amplifier 28 in FIG. 16 can be omitted in some cases, especially when the irradiating laser 14 is operated at a relatively high power level of, for example, 100 mW or more. Since, integrated circuitry is not present on the MEM devices 100 to be analyzed with the TIVA apparatus 10 of FIG. 16, there is generally no dc background signal level (e.g. due to biasing of the integrated circuitry) which must be blocked by the voltage amplifier 28 so that the amplifier 28, when used, can be either ac-coupled or dc-coupled.

The optical filter 40 can also be omitted, in general, in the embodiment of the TIVA apparatus 10 in FIG. 16 since the laser 14 only functions to provide localized heating to the structure of the MEM device 100; and there is no concern about the photogeneration of carriers (i.e. electrons and holes) since no integrated circuitry is present that could be affected by such photogenerated carriers. This relaxes the requirements on the wavelength of the laser 14 so that any wavelength in the range of 0.3–2.5 $\mu$m can be used for top-side irradiation. For bottom-side irradiation through the substrate, the laser wavelength must still be selected so that it is transmitted through the substrate. In the case of a silicon substrate, this generally limits the laser wavelengths to the range of 1.2–2.5 $\mu$m. For irradiation of a MEM device 100 formed on a gallium arsenide (GaAs) substrate, the laser wavelength can be in the range of 0.9–2.5 $\mu$m for transmission through the substrate.

The matter set forth in the foregoing description and accompanying drawings is offered by way of illustration only and not as a limitation. Other applications and variations of the thermally-induced voltage alteration apparatus and method will become evident to those skilled in the art. Although the TIVA apparatus 10 has been described for use in analyzing MEM devices 100 formed on a semiconductor substrate, the present invention is applicable to the analysis of MEM devices formed on any type of substrate, including glass, fused silica, ceramic, polymer and metal substrates. The actual scope of the invention is intended to be defined in the following claims when viewed in their proper perspective based on the prior art.

What is claimed is:

1. An apparatus for analyzing a microelectromechanical (MEM) device formed on a substrate, comprising:
    (a) a laser producing a laser beam;
    (b) means for focusing and scanning the laser beam to irradiate a portion of the MEM device and thereby generate an induced voltage at the location of any short-circuit defects therein, the focusing and scanning means further providing a position signal to indicate the location of the laser beam on the irradiated portion of the MEM device; and
    (c) means, comprising inputs of the induced voltage and the position signal, for indicating the location of each short-circuit defect within the irradiated portion of the MEM device.

2. The apparatus of claim 1 wherein the substrate comprises silicon.

3. The apparatus of claim 2 wherein the MEM device comprises a plurality of stacked layers of polycrystalline silicon.

4. The apparatus of claim 1 further including a stage for holding the MEM device.

5. The apparatus of claim 4 wherein the stage comprises means for heating or cooling the MEM device.

6. The apparatus of claim 1 wherein the laser beam has a wavelength in the range of 0.3 $\mu$m to 2.5 $\mu$m.

7. The apparatus of claim 6 wherein the laser comprises a neodymium:yttrium-vanadium-oxide (Nd:YVO$_4$) laser or a neodymium:aluminum:garnet (Nd:YAG) laser.

8. The apparatus of claim 1 further comprising a photodetector for detecting a portion of the laser beam reflected or scattered from the MEM device.

9. The apparatus of claim 8 wherein the photodetector is a silicon or germanium photodetector.

10. The apparatus of claim 8 wherein the means for indicating the location of each short-circuit defect within the irradiated portion of the MEM device further includes an input from the photodetector to generate a reflected-light image of the irradiated portion of the MEM device.

11. The apparatus of claim 10 wherein the means for indicating the location of each short-circuit defect within the irradiated portion of the MEM device provides the reflected-light image of the irradiated portion of the MEM device superposed with an image of each short-circuit defect within the irradiated portion of the MEM device.

12. The apparatus of claim 1 further including a voltage amplifier, connected between the MEM device and the means for indicating the location of each short-circuit defect within the irradiated portion of the MEM device, for amplifying the induced voltage.

13. The apparatus of claim 12 wherein the voltage amplifier is an ac-coupled voltage amplifier.

14. The apparatus of claim 1 further including a switch matrix, connected between the MEM device and the means for indicating the location of each short-circuit defect within the irradiated portion of the MEM device, for selecting among a plurality of electrical connections to the MEM device.

15. The apparatus of claim 14 wherein the switch matrix is computer controlled.

16. The apparatus of claim 1 wherein the laser beam irradiates the MEM device from a top side of the substrate proximate to the MEM device.

17. The apparatus of claim 1 wherein the laser beam irradiates the MEM device from a bottom side of the substrate distal from the MEM device, with the laser beam being transmitted through the substrate.

18. The apparatus of claim 1 wherein the means for focusing and scanning the laser beam comprises a scanning optical microscope.

19. The apparatus of claim 1 wherein the means for indicating the location of each short-circuit defect within the irradiated portion of the MEM device further comprises an image processor.

20. An apparatus for analyzing a microelectromechanical (MEM) device formed on a substrate, comprising:
    (a) a stage for holding the MEM device;
    (b) a laser generating a laser beam;
    (c) a scanning optical microscope for focusing and scanning the laser beam to irradiate a portion of the MEM device and thereby generate an induced voltage at the location of any short-circuit defect therein, the scanning optical microscope further providing a position signal to indicate the location of the laser beam on the irradiated portion of the MEM device; and (d) a display for receiving inputs of the induced voltage and the position signal to indicate the location of each short-circuit defect within the irradiated portion of the MEM device.

21. The apparatus of claim 20 wherein the substrate comprises silicon, and the MEM device comprises polycrystalline silicon.

22. The apparatus of claim 20 wherein the stage comprises means for heating or cooling the MEM device.

23. The apparatus of claim 20 wherein the laser beam has a wavelength in the range of 0.3 $\mu$m to 2.5 $\mu$m.

24. The apparatus of claim 20 wherein the scanning optical microscope further includes a photodetector for detecting a portion of the laser beam reflected or scattered from the MEM device.

25. The apparatus of claim 24 wherein the display further includes an input from the photodetector to generate a reflected-light image of the irradiated portion of the MEM device.

26. The apparatus of claim 20 further including a voltage amplifier connected between the MEM device and the display for amplifying the induced voltage.

27. The apparatus of claim 20 further including a switch matrix connected between the MEM device and the display for selecting among a plurality of electrical connections to the MEM device.

28. An apparatus for analyzing a microelectromechanical (MEM) device formed on a substrate, comprising:

(a) a constant-current source connected to the MEM device to supply a constant current and a variable voltage thereto, the voltage provided by the constant-current source to the MEM device changing in response to a change in power demand by the MEM device;

(b) a laser producing a laser beam;

(c) means for focusing and scanning the laser beam to irradiate a portion of the MEM device and thereby change the power demand by the MEM device when the laser beam irradiates any short-circuit defect in the MEM device, the focusing and scanning means providing a position signal to indicate the location of the laser beam on the MEM device; and (d) means, comprising inputs of the changing voltage and the position signal, for indicating the location of each short-circuit defect within the irradiated portion of the MEM device.

29. The apparatus of claim 28 wherein the substrate comprises a semiconductor substrate.

30. The apparatus of claim 29 wherein the laser beam has a wavelength in the range of 0.3 $\mu$m to 2.5 $\mu$m.

31. The apparatus of claim 28 further comprising a stage for holding the MEM device.

32. The apparatus of claim 31 wherein the stage comprises means for heating or cooling the MEM device.

33. The apparatus of claim 28 further comprising a photodetector for detecting a portion of the laser beam reflected or scattered from the MEM device.

34. The apparatus of claim 33 wherein the means for indicating the location of each short-circuit defect within the irradiated portion of the MEM device further includes an input from the photodetector to generate a reflected-light image of the MEM device.

35. The apparatus of claim 34 wherein the reflected-light image of the MEM device is superposed with an image of the short-circuit defect.

36. The apparatus of claim 28 further comprising a voltage amplifier, connected between the constant-current source and the means for indicating the location of each short-circuit defect within the irradiated portion of the MEM device, for amplifying the changing voltage.

37. The apparatus of claim 28 further comprising a switch matrix connected between the constant-current source and the MEM device for controlling a plurality of electrical connections to the MEM device.

38. The apparatus of claim 37 wherein the switch matrix is computer controlled.

39. The apparatus of claim 28 wherein the means for indicating the location of each short-circuit defect within the irradiated portion of the MEM device comprises an image processor.

40. The apparatus of claim 28 wherein the means for focusing and scanning the laser beam to irradiate a portion of the MEM device comprises a scanning optical microscope.

41. A method for analyzing a microelectromechanical (MEM) device, comprising steps for:

(a) irradiating a portion of the MEM device with a focused and scanned laser beam and thereby generating an induced voltage at the location of any short-circuit defect therein; and (b) sensing the position of the focused and scanned laser beam and the induced voltage for determining the location of each short-circuit defect in the MEM device.

42. The method of claim 41 further including a step for heating or cooling the MEM device.

43. The method of claim 41 wherein the sensing step comprises forming an image showing the location of each short-circuit defect within the MEM device.

44. The method of claim 41 further including a step for generating a reflected-light image of the irradiated portion of the MEM device by detecting a reflected or scattered portion of the irradiating laser beam.

45. The method of claim 44 further including a step for amplifying the induced voltage prior to the sensing step.

46. A method for analyzing a microelectromechanical (MEM) device, comprising steps for:

(a) supplying electrical power to the MEM device from a constant-current source having a constant current and a variable voltage that changes in response to a change in a power demand by the MEM device;

(b) irradiating a portion of the MEM device with a focused and scanned laser beam and thereby changing the power demand of the MEM device; and (c) detecting any short-circuit defects within the irradiated portion of the MEM device by sensing a position of the focused and scanned laser beam and a change in the variable voltage from the constant-current source.

47. The method of claim 46 wherein the step for detecting each short-circuit defect within the MEM device further comprises forming an image showing the location of the short-circuit defect in the MEM device.

48. The method of claim 47 further including steps for forming a reflected-light image of the MEM device and superposing the reflected light-image with the image of the short-circuit defect thereby forming a composite image for locating each short-circuit defect in the irradiated portion of the MEM device.

49. The method of claim 48 wherein the reflected-light image is generated by detecting a portion of the laser beam reflected or scattered from the MEM device using a photodetector.

50. The method of claim 46 further comprising a step for amplifying the change in the variable voltage prior to the detecting step.

* * * * *